United States Patent [19]

Tanizawa et al.

[11] Patent Number: 5,124,776

[45] Date of Patent: Jun. 23, 1992

[54] BIPOLAR INTEGRATED CIRCUIT HAVING A UNIT BLOCK STRUCTURE

[75] Inventors: Tetsu Tanizawa, Kawasaki; Takehito Doi, Yokohama; Hideo Tokuda; Shigenori Ichinose, both of Kawasaki, all of Japan

[73] Assignee: Fujitsu Limited, Kawasaki, Japan

[21] Appl. No.: 492,898

[22] Filed: Mar. 13, 1990

[30] Foreign Application Priority Data

Mar. 14, 1989 [JP] Japan .................. 1-61818
Mar. 31, 1989 [JP] Japan .................. 1-81917

[51] Int. Cl.⁵ .......................... H01L 27/10
[52] U.S. Cl. .......................... 357/45; 357/40
[58] Field of Search .......... 357/45, 45 M, 40

[56] References Cited

U.S. PATENT DOCUMENTS

| | | | |
|---|---|---|---|
| 4,623,911 | 11/1986 | Pryor | 357/45 |
| 4,716,452 | 12/1987 | Kondoh et al. | 357/45 |
| 4,833,520 | 5/1989 | Ito et al. | 357/45 |
| 4,841,352 | 6/1989 | Aso | 357/45 |
| 4,870,300 | 9/1989 | Nakaya et al. | 357/45 |
| 4,893,170 | 1/1990 | Tokuda et al. | 357/45 |

FOREIGN PATENT DOCUMENTS

| | | | |
|---|---|---|---|
| 58-78450 | 5/1983 | Japan | 357/45 M |
| 59-165436 | 9/1984 | Japan | 357/45 M |
| 61-30050 | 2/1986 | Japan | 357/45 M |
| 62-166542 | 7/1987 | Japan | 357/45 |
| 63-283038 | 11/1988 | Japan | 357/45 |
| 1-23552 | 1/1989 | Japan | 357/45 |

Primary Examiner—Rolf Hille
Assistant Examiner—Steven Lake
Attorney, Agent, or Firm—Staas & Halsey

[57] ABSTRACT

A semiconductor integrated circuit comprises a plurality of first hierarchical units of logic devices each including a plurality of bipolar logic devices having a polycell structure. The bipolar logic devices have a first standardized size in a first direction and are arranged in a second direction for a second standardized size in each first hierarchical unit. Each of the first hierarchical units is defined by first and second main edges extending in the second direction for the second standardized size, and first and second side edges extending in the first direction for the first standardized size. Each of the first hierarchical units consumes a generally identical electric power and has a first power feed system extending in the second direction for the second standardized size for feeding the electric power to the bipolar logic devices therein. At least a part of the first hierarchical units are arranged in the first direction to form a plurality of second hierarchical units having respective lengths in the first direction wherein the first and second side edges are aligned in the first direction in each of the second hierarchical units. Further, the second hierarchical units are disposed such that there are at least two second hierarchical units having respective positions which are different in the second direction. Furthermore, there is provided a second power feed system extending in the first direction so as to cross the first power feed system for feeding the electric power thereto.

22 Claims, 19 Drawing Sheets

BIPOLAR INTEGRATED CIRCUIT HAVING A UNIT BLOCK STRUCTURE

BACKGROUND OF THE INVENTION

The present invention generally relates to semiconductor integrated circuits and more particularly to a bipolar integrated circuit having a unit block structure.

In integrated circuits, particularly those used for logic operation, a high operational speed is the essential factor. Because of this reason, logic integrated circuits are usually constructed of bipolar transistors connected to form a so-called emitter coupled logic (ECL). As ECL devices need a substantial, large current for high speed operation, supply of sufficient electric power to each of the logic devices in the integrated circuit becomes increasingly difficult with increasing integration density. Thus, how to supply sufficient electric power to the logic devices in the integrated circuit while maintaining a high integration density is one of the major problems when designing an integrated circuit using the ECL devices.

On the other hand, there is an increasing demand to fabricate a variety of integrated circuits in correspondence to specific purposes though such circuits would be produced in limited number. Such so-called semi-custom made integrated circuits are commonly constructed using a so-called gate array structure shown for example in FIG. 1. Referring to FIG. 1, a number of logic gates having an identical construction and size are arranged on a surface of a semiconductor chip 10 as an array of basic cells 12. The basic cells 12 may be arranged in a plurality of columns 14 or 14a as shown in FIG. 1. Each of the cells 12 has an identical size and construction. The chip, or master slice, having the structure as shown in FIG. 1, is mass-produced and the interconnection between the basic cells 12 is made according to the specific purpose of the integrated circuit which of course changes depending on the type and function required for the integrated circuit.

In such an integrated circuit having a gate array structure, usually not all of the basic cells are used, some of them usually remaining unused. This is because the basic cells are provided on the chip with redundancy in order to secure sufficient number of gates on the chip even when the chip is used for purposes wherein a very large number of basic cells are needed. Thus, the integration density of the gate array structure becomes inevitably lower than the maximum integration density which the integrated circuit is potentially capable of realizing, and associated therewith, there is a problem that the operational speed of the integrated circuit cannot be maximized. Further, there is a problem in that a complex interconnection pattern is needed for connecting the ECL gates in the chip arranged into the basic cells, and associated therewith, there arises a problem in that the average length of interconnection in the chip is increased. Such an increase in the interconnection of course invites a decrease in the operational speed of the integrated circuit. Further, provision of the interconnection becomes increasingly difficult with increasing integration density because of the appearance of a complicated interconnection pattern on the chip during the process of pattern designing, and finding of a path for new interconnections in the region where interconnections are already provided becomes increasingly difficult. Furthermore, such a gate array cannot provide a region for memories or other utilities on the chip, as the chip is provided as the master slice wherein the basic cells are provided so as to cover substantially the entire region of the chip.

On the other hand, there is another concept for designing custom made integrated circuits called the standard cell structure or polycell structure shown in FIG. 2. In this polycell structure, each of the logic devices such as inverters, NOR gates, flip-flops and the like are patterned as polycells 16a each having a standardized, constant height when measured in the Y-direction as shown in FIG. 2. The polycells further have various widths in the X-direction in the drawing, depending on their types and functions. Furthermore, the polycells 16a are assembled in the form of polycell column 16 extending in the X-direction by arranging it so that top edges of adjacent polycells are aligned with each other and bottom edges of adjacent polycells are also aligned with each other as shown in FIG. 2. A number of such polycell columns are formed on the chip, and interconnection between the polycells is made either within the cell columns, or using the space between the cell columns, or crossing one or more cell columns. By using this polycell structure, one can increase the integration density substantially by optimizing the design of the polycells and thereby maximization of the operational speed becomes possible. Note that, in the case of the polycell type integrated circuit, a mask is produced for each of the newly designed integrated circuits and an optimum designing of the integrated circuit becomes possible. Because of this reason, it is also possible to provide a region M for mega-cells, such as memories or other logic units, as desired.

This polycell structure is currently used successfully in the integrated circuits constructed of MOS or CMOS devices. In the MOS or CMOS devices, the electric power consumption is very small and substantially zero in the stationary mode, although there is a compromise to operational speed. In such a low power consumption integrated circuit, no particular problem arises with respect to the feeding of electric power to the devices in the chip and the power conductor for feeding the electric power to each of the polycells may be treated similarly to the interconnection pattern for carrying signals.

FIG. 3 shows a typical example of connecting a power conductor 17, which is commonly connected to a number of polycells 16a in the polycell column 16, to a main power conductor 18 which may be a power terminal pad itself or may be a power conductor connected to a power terminal pad. According to this construction, an electric power supplied externally to the power terminal pad is distributed to a number of polycells 16a, passing through the power conductors 17. As illustrated, each power conductor 17 is extended perpendicularly to the main power conductor 18 and is connected thereto at via-holes 18a. As the current flowing through the power conductor 17 is very small in this case, no particular concern is needed regarding the line width of the power conductor 17 and the numbers and types of the devices included in the polycell column 16 may be variously changed. It should be noted that the phrase "line width" used herein means the width of the conductor measured in the plane of the chip in a direction perpendicular to the elongated direction of the conductor.

When the polycell structure is applied in the case of bipolar integrated circuits including a number of ECL or CML gates, however, there arises a problem of how to supply sufficient electric power to each of the polycells in the integrated circuit. Note that the ECL or CML gate constituting such an integrated circuit needs a substantially large electric current or power for high speed operation. Thus, it is necessary to increase the line width of the power conductors 17 in FIG. 3. When the line width is not increased sufficiently, the current that can be supplied through the power conductors 17 is limited and the number of polycells included in one polycell column has to be decreased. Otherwise, an unacceptable voltage drop may occur in the power conductor 17. When the line width is increased, however, cases occur rather often in which the line width of the power conductors 17 becomes excessively large, reaching a thickness two, three or more times than the height of the polycell column 16. When the line width of the power conductors is increased as to meet the demand for the increased electric power, a substantial area on the chip is occupied by the power conductors and a decrease of the channel area used for interconnection of the ECL gates as well as a decrease of the integration density are invited.

Attempt to overcome this problem by using a multilevel interconnection structure for the power conductors have been generally unsuccessful because of the reason that via-holes, used for inter-layer connection of the polycells to the power conductors, occupy a considerable space. It should be noted that a very large number of power via-holes are needed in order to supply sufficient electric power to any of the ECL gates on the chip. Such a large number of via-holes decreases the possible paths for the routing channels used for passing the interconnection conductors and the degree of freedom when designing the interconnection pattern or "routability" is reduced substantially. It should be noted that the use of regular criss-cross power feed pattern which is used in the gate array structure has also been unsuccessful in the case of the polycell structure as the regularly repeated power conductors do not generally coincide with the corresponding power terminals of the polycells because of the variable width of the polycells in the polycell column.

When the integrated circuit includes the mega-cell region M as in the case of FIG. 2, another problem occurs in that the configuration of the power conductors has to be modified in a region in the vicinity of the mega-cell region M. In this case, the power conductors such as the power conductor 17 shown in FIG. 3 have to be connected to a main power conductor surrounding the region M. As a number of power conductors 17 are connected to such a main power conductor, the main power conductor inevitably occupies a large area. This substantially limits the possible location of the chip where the mega-cell region M can be provided. Such a modification of the power conductor pattern, together with the limitation regarding the possible location of the mega-cells, causes difficulty regarding the automatic and optimum designing of the ECL integrated circuits using the so-called computer-aided design (CAD) process.

Further, when a typical CAD process which combines the channel router process together with the compaction process is applied to the designing of the polycell structure, the obtained polycell column usually extends for almost a full chip length, and because of this, the channel area for interconnection is formed also to extend one full chip length. In such a long channel area, there is a tendency that the degree of channel utilization varies in each part of the channel area such that one part of the channel area is used heavily for interconnection while the other part of the channel area is used less heavily or not used at all. Because of these circumstances, the degree of channel utilization in the conventional polycell type integrated circuit usually remains at about 30–40% and a substantial part of the channel area remains unused or used but insufficiently.

SUMMARY OF THE INVENTION

Accordingly, it is a general object of the present invention to provide a novel and useful semiconductor integrated circuit and a method of fabricating the same, wherein the foregoing problems are eliminated.

Another object of the present invention is to provide a semiconductor integrated circuit and a method of fabricating the same, wherein a number of ECL gates are assembled with high integration density in the form of a polycell structure and wherein sufficient electric power is supplied to each of the ECL gates therein from a fixed, regular power feed system. According to the present invention, the operational speed of the integrated circuit is maximized by using the high speed ECL gates assembled with maximum integration density.

Another object of the present invention is to provide a semiconductor integrated circuit wherein a number of ECL gates are arranged into a polycell structure comprising a number of polycells each having a first predetermined size in a first direction and a variable size in a second direction perpendicular to the first direction. The polycells are aligned in the second direction so as to form a unit block of polycells having the first predetermined size in the first direction and a second predetermined size in the second direction, and a number of unit blocks are disposed on the chip area of the integrated circuit in the form of mini-macro blocks. Each of the unit blocks is defined by a first long edge extending in the second direction for a length equal to said second predetermined size, a second long edge being opposite to the first long edge and extending in the second direction for a length equal to said second predetermined size, a first side edge extending in the first direction for a length equal to said first predetermined size, and a second side edge being opposite to the first side edge and extending in the first direction for a length equal to said first predetermined size, and first and second power conductors being disposed along the first and second long edges. The mini-macro blocks are formed by assembling a number of unit blocks as defined above such that the unit blocks are arranged adjacent to each other in the first direction. Further, a plurality of mini-macro blocks are assembled and interconnected with each other to form a macro-block such as ALU which acts as a completed functional block of the chip. Note that the mini-macro blocks usually do not have the completed interconnection and thus not act as the completed functional block. The polycells are interconnected with each other within each macro-block to form a completed circuit unit in each of the macro-block block. Further, the mini-macro blocks and the macro-blocks are disposed on the chip freely, except for one constraint, i.e. all the unit blocks extend in the same direction throughout all of the macro-blocks on the chip.

According to the present invention, the power consumption in each of the unit blocks is held almost constant because of the standardized size of the unit blocks and the unit blocks can be disposed freely on the chip area of the integrated circuit while electric power from a fixed power feed pattern being supplied. It should be noted that, because of the polycell structure in the unit blocks, high integration density is maintained wherever the unit block is provided on the chip. When the unit blocks are assembled into the mini-macro blocks and the layouting of the integrated circuit is performed by using the mini-macro blocks, the efficient layout of a semiconductor pattern becomes possible by use of automatic design facilities such as CAD without sacrificing high integration density. Further, because of the increased degree of freedom at the time of laying out a semiconductor pattern, the integrated circuit of the present invention can include mega-cells such as random access memories (RAM) and read-only memories (ROM) or arithmetic logic units (ALU) not designed by the polycell or standard cell technique, on any desired location on the chip area.

Another advantageous feature of the present invention is that, by assembling a number of unit blocks into the mini-macro blocks, spaces are secured between adjacent mini-macro blocks and these spaces can be used freely for global channels used for passage of interconnection conductors connecting the mini-macro blocks. Because the passage for interconnection conductors connecting separated mini-macro blocks is thus provided outside the mini-macro blocks and thus outside the unit blocks, problems such as interconnection conductors crossing the polycells without any connections thereto are eliminated and the channel region hitherto provided in the polycells for this purpose can be eliminated. As a result, the polycells used in the unit blocks can have a reduced size as compared to the prior art polycells and the integration density is increased further.

Still another advantageous feature pertinent to the present invention is that, by providing the first and second power conductors in correspondence to the first long edge and second long edge of the unit blocks, feeding of electric power to each of the unit blocks can be achieved easily by using a fixed power feed system. For example, by providing a number of third and fourth power conductors at a level above the level of the first and second power conductors such that these third and fourth power conductors extend in the first direction with alternating and regular repetition in the second direction, it becomes possible to supply a sufficient electric power to any of the unit blocks either isolated or forming the mini-macro block or macro-block, from a suitable pair of the third and fourth power conductors crossing therewith if the pitch of repetition is set suitably.

Other objects and further features of the present invention will become apparent from the following detailed description when read in conjunction with the attached drawings.

DETAILED DESCRIPTION

First, the concept of unit block which forms the basis of the present invention will be described with reference to FIG. 4 which shows the plan view of a typical unit block 22 in plan view.

Figure 4:
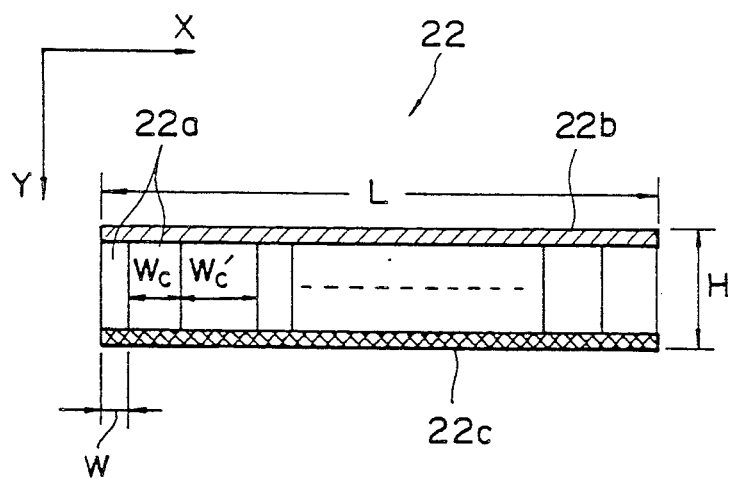
FIG. 4 is a plan view for explaining the concept of the unit blocks used in the integrated circuit of the present invention.

Referring to FIG. 4, the unit block 22 has a constant height H in the Y-direction and is constituted by arranging various polycells 22a each having a height equal to the height H in the Y-direction. As usual, each of the polycells 22a forms a logic device such as an OR or AND gate and may have various widths W, W', etc. in the X-direction. Further, the polycells are arranged in each of the unit blocks 22 such that the unit block 22 has a constant, standardized length L in the X-direction. For example, each of the unit blocks 22 may include about 10–20 polycells 22a therein and has a length L of about 600–800 $\mu$m. Typical height H of the unit block 22 may be about 78 $\mu$m, for example.

The unit block 22 further has a pair of parallel power conductors 22b and 22c extending in the X-direction, one conductor (22b) along a top edge of the unit block and the other conductor (22c) along a bottom edge of the unit block 22. In other words, each of the polycells 22a share the power conductors 22b and 22c in common with other polycells in the unit block 22, and the polycells are fed electric power through these pair of power conductors 22b and 22c. As will be explained below, it is not necessary that each of these power conductors 22b and 22c be formed by a single conductor strip but may be comprised instead of a plurality of conductor strips carrying respective source voltages.

Before describing various arrangements of the unit blocks on a chip area to form an integrated circuit, a description will be given first about the contents of the polycells 22a.

Figure 5:
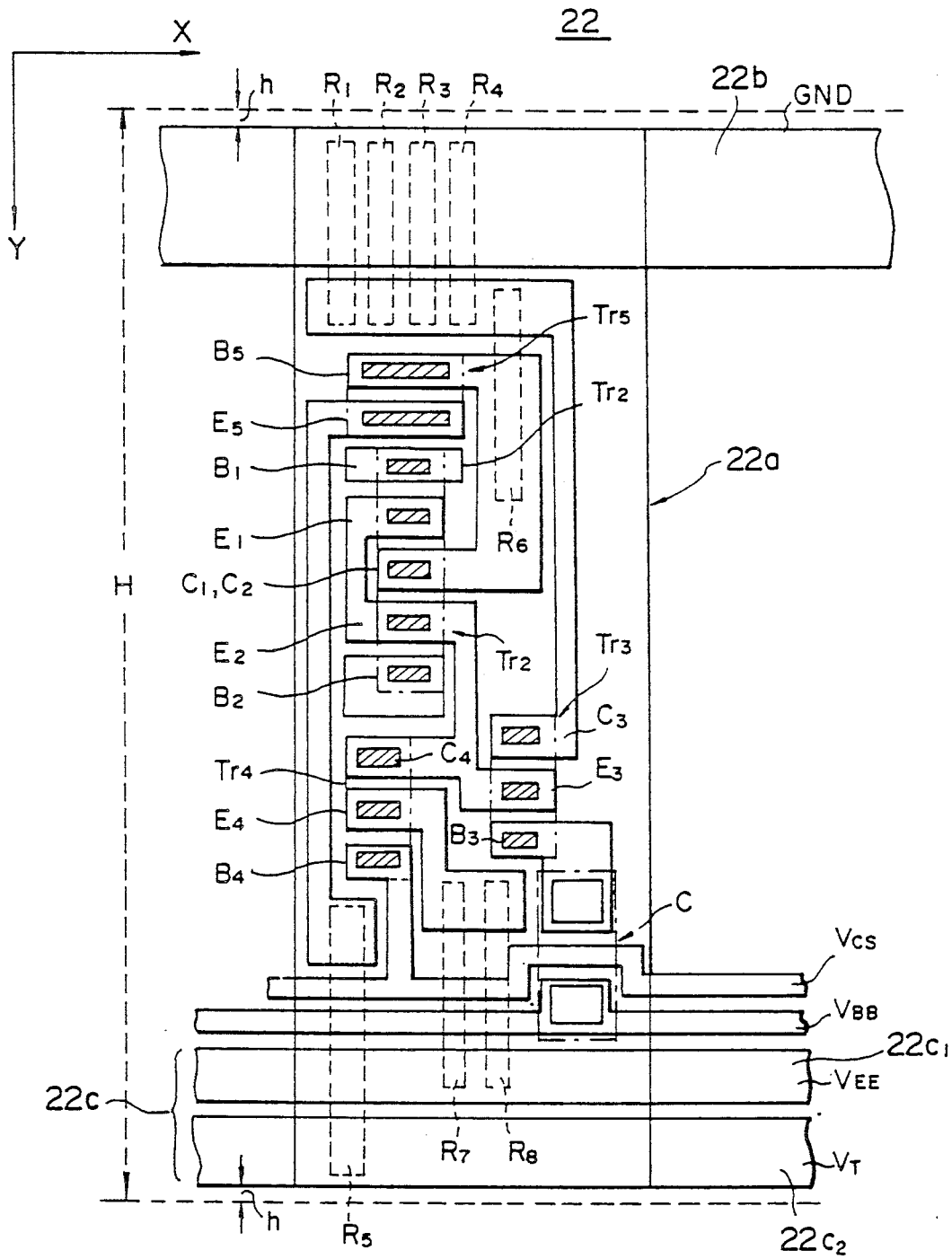
FIG. 5 is a semiconductor pattern showing a NOR gate as an example of the polycell structure which constitutes the unit block of FIG. 4.

FIG. 5 shows an example of the logic device formed in the unit block 22 as the polycell 22a. In this example, the logic device is a typical NOR gate of ECL construction of which a circuit diagram is shown in FIG. 6.

Figure 6:
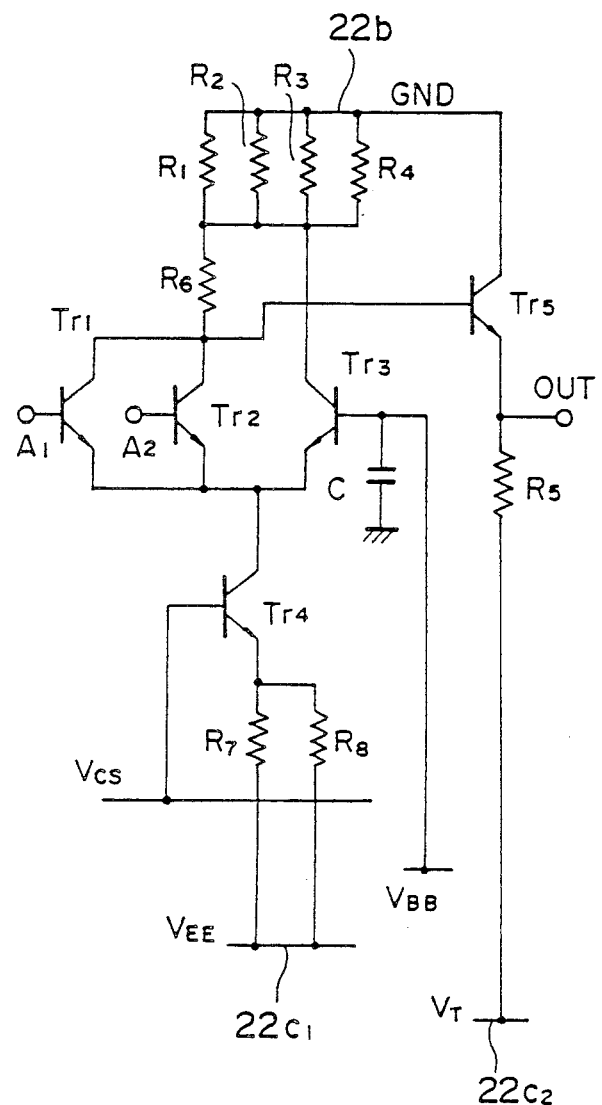
FIG. 6 is an equivalent circuit diagram corresponding to the semiconductor pattern of FIG. 5.

Referring to FIGS. 5 and 6, the NOR gate includes transistors Tr1 and Tr2 for receiving input signals A1 and A2, and another transistor Tr3, supplied with a reference voltage $V_{BB}$ at a base thereof and forms a current switch together with the foregoing transistors Tr1 and Tr2, is also provided.

Referring particularly to the equivalent circuit diagram of FIG. 6, the transistors Tr1 and Tr2 have respective collectors commonly connected and the collectors thus connected are further connected to the power conductor 22b forming the ground conductor via load resistances R1, R2, R3, R4 and R6. The transistors Tr1 and Tr2 further have respective emitters commonly connected and these emitters are further connected to an emitter of a transistor Tr3. The transistor Tr3, in turn, has a collector which is connected to the power conductor 22b via the load resistances R1, R2, R3 and R4. Further, there is provided another transistor Tr4 acting as a constant current source, wherein the transistor Tr4 has a base to which a constant bias voltage $V_{CS}$ is supplied, an emitter to which load resistances R7 and R8 are connected, and a collector connected commonly to the emitters of the transistors Tr1, Tr2 and Tr3. The load resistances R7 and R8 are provided in parallel connection and connected commonly to the source voltage $V_{EE}$ provided by a conductor 22c1 acting as one member of the power conductor 22c.

Furthermore, still another transistor Tr5 is provided in correspondence to an output stage, wherein the transistor Tr5 has a base connected to a node where the collectors of the transistors Tr1, Tr2 are connected to the resistance R6, a collector connected directly to the ground conductor 22b, and an emitter connected to a source voltage $V_T$ provided by another conductor 22c2 of the power conductor 22c via a resistances R5.

In operation, when low level input signals are applied to the input terminals A1 and A2, the transistors Tr1 and Tr2 are turned off and the transistor Tr3 is turned on. As a result, a high level output is obtained at an output terminal OUT. When one or both of the input signals to the input terminals A1 and A2 have a high level, the transistor Tr3 is turned off. As a result, a low output signal is obtained at the output terminal OUT. Thus, this circuit performs an operation of a NOR gate.

Next, the actual pattern of the NOR gate will be described with reference to FIG. 5. In FIG. 5, the elements corresponding to the elements shown in the circuit diagram of FIG. 6 are given identical reference numerals. It should be noted that the hatched rectangular regions in FIG. 5 represent contact holes.

In FIG. 5, the emitter, base and collector of the transistor Tr1 are represented by E1, B1 and C1, while the emitter, base and collector of the transistor Tr2 are represented by E2, B2 and C2. Thus, it will be understood that the collectors C1 and C2 are provided in common. Similarly, the emitters E1 and E2 are provided in common. This means that the transistors Tr1 and Tr2 form a transistor having a multiple emitter and multiple base construction. On the other hand, the transistors Tr3, Tr4 and Tr5 are provided separately from each other and the emitters, bases and collectors thereof are represented respectively by E3–E5, B3–B5, and C3–C5. It should be noted that the numbers "3", "4" and "5" respectively indicate the transistors Tr3, Tr4 and Tr5. The collector C5 cannot be seen in this drawing.

In order to allow a high power and high speed operation of the logic gate, the resistances R1–R4 are electrically connected in parallel to each other to the power conductor 22b of which the level is held at the ground level GND. Because of the parallel connection of the resistances R1–R4, a large current flows through the transistors Tr1, Tr2 and Tr3. This power conductor 22b extends in the X-direction along the array of polycells when a number of such polycells are arranged to form the unit block as shown in FIG. 4. Similarly, the resistances R7 and R8 are electrically connected in parallel to each other to the power conductor 22c1 carrying the source voltage $V_{EE}$ which forms the power conductor 22c together with another power conductor 22c2 for carrying the source voltage $V_T$. The power conductor 22c2 is connected to the emitter of the transistor Tr5 via the resister R5.

Figure 7:
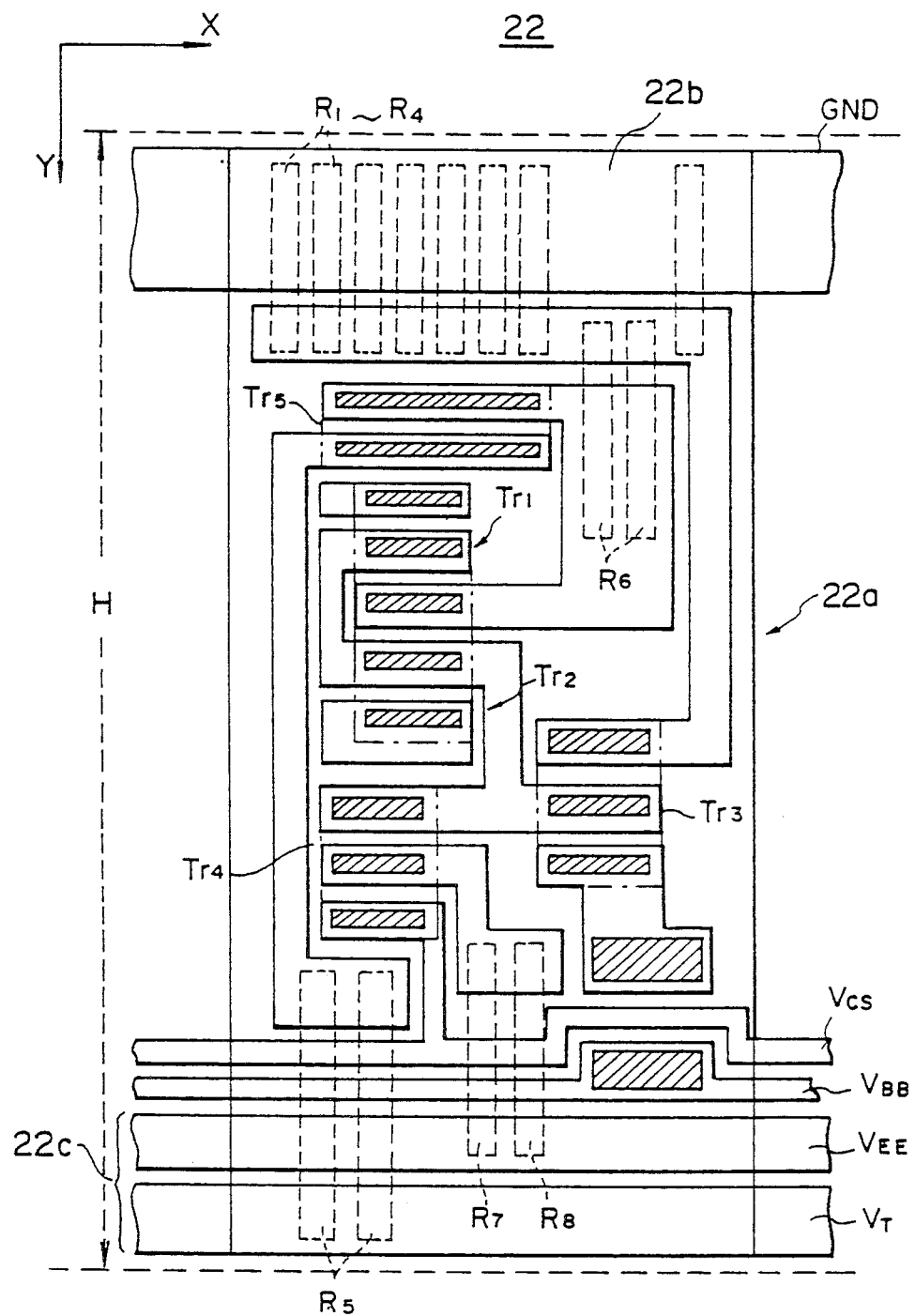
FIG. 7 is a semiconductor pattern showing a NOR gate, essentially identical to that of FIG. 5 but having an increased power, as another example of the polycell structure constituting the unit block of FIG. 4.

When the logic gate is constructed as above, the power of the gate and thus the operational speed of the gate is easily increased by simply expanding the size of the pattern of FIG. 5 in the X-direction. An example of such expanded pattern is shown in FIG. 7. In FIG. 7, the elements corresponding to those already described with reference to FIG. 5 are given identical reference numerals and the description thereof will be omitted. Referring to FIG. 7, it will be understood that the size of the emitter, base and the collector of the transistors Tr1–Tr5 is simply increased in the X-direction while the size is not changed in the Y-direction. Further, in order to allow increased current, the number of resistances connected parallel to the power conductors is increased.

It should be noted that the power of the logic gate having such a construction is thus simply proportional to the lateral size measured in the X-direction. As the height measured in the Y-direction is held constant, this means that the power of the logic gate is proportional to the area which the logic gate occupies. In other words, by constructing the polycells such that the transistors in the polycells have elongated terminal electrodes in the X-direction and such that the electric current flows generally in the Y-direction from the power conductor 22b provided at the top edge of the polycell to the power conductor 22c at the bottom edge of the polycell, the electric power consumed in a unit area of the polycell or power density is maintained substantially constant even when the size of the polycells is varied. Further, when a number of such polycells are arranged to form the unit block having a standardize size in the X- and Y-direction, the electric power density remains substantially constant and thus, the electric power which the unit block 22 requires is kept substantially constant.

Note that in the construction of FIG. 5, the polycell 22a has the height H and the power conductors 22b and 22c are provided with a slight offset h towards the inside of the unit block 22 in the Y-direction.

Figure 8:
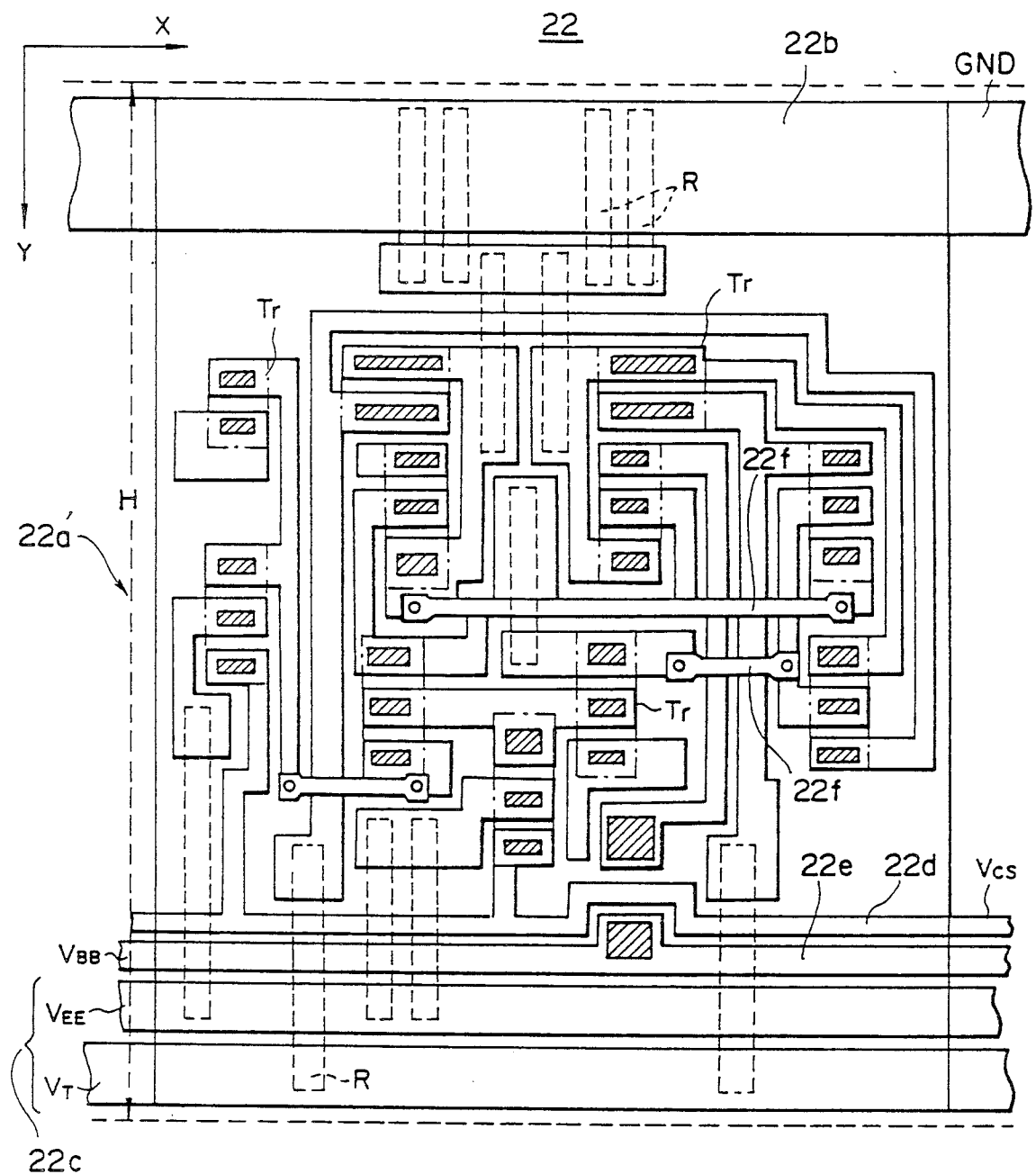
FIG. 8 is a semiconductor pattern showing a latch circuit as an example of the polycell structure forming the unit block of FIG. 4.

FIG. 8 shows another example of the polycell structure wherein a polycell 22a' forms a latch circuit. This polycell structure also has a similar preferable feature in that the electrodes of various transistors generally designated as Tr in FIG. 8 extend in the X-direction and the power of the latch circuit is increased by simply expanding the lateral size of the transistors Tr in the X-direction. Note that the polycell 22a of FIG. 5 or 7 or the polycell 22a' of FIG. 8 has conductors 22d and 22e extending in the X-direction throughout the unit block 22 at respective positions or levels in the Y-direction for supplying bias voltages $V_{CS}$ and $V_{BB}$. By setting the position of the conductors 22d or 22e at a predetermined level in the Y-direction in the plan view, supply of various bias voltages to the polycells in the unit block can be achieved easily and systematically. Further, wiring of the logic circuit is completed within each polycell 22a' by conductors 22f extending in the X-direction except for the hatched terminal regions for external connection to other polycells.

The size or length L of the unit block 22 is determined based on the consideration about the power needed by the unit block and the loss of polycells in the unit block as well as the ease of layout by CAD. Note that the power needed by the unit block 22 is increased with increasing length L of the unit block in the X-direction. When the length L is excessive, conductor strips having a very large line width have to be used for the power conductors 22b and 22c and this inevitably causes increase of the height H of the unit block. Such an increase of the height H caused by the increase of width of the power conductors 22b and 22c causes decrease of the the integration density. On the other hand, when the length L of the unit block is decreased excessively, for example to a length corresponding to two or three polycells, the proportion of loss of area in the unit block caused by failure of completely filling the area of the unit block by the polycells, is increased. In other words, the proportion of area of the unit block which is too small to be used for a polycell is increased. Note that, as the unit block has the predetermined, standardized length L, the filling of the area in the unit block by the polycells can cause a loss of area for one polycell in the worst case. Although the loss of the area in the unit block does not increase more, the proportion of the loss nevertheless increases with decreasing length L. For example, when the length L is set to about twice as large as an average width of the polycells measured in the X-direction, a loss of 50% can occur. In the present embodiment, the length L is preferably set to about 600 μm so as to contain about 10–20 polycells in the unit block 22. In this case, the maximum loss is 5–10%.

Figure 9:
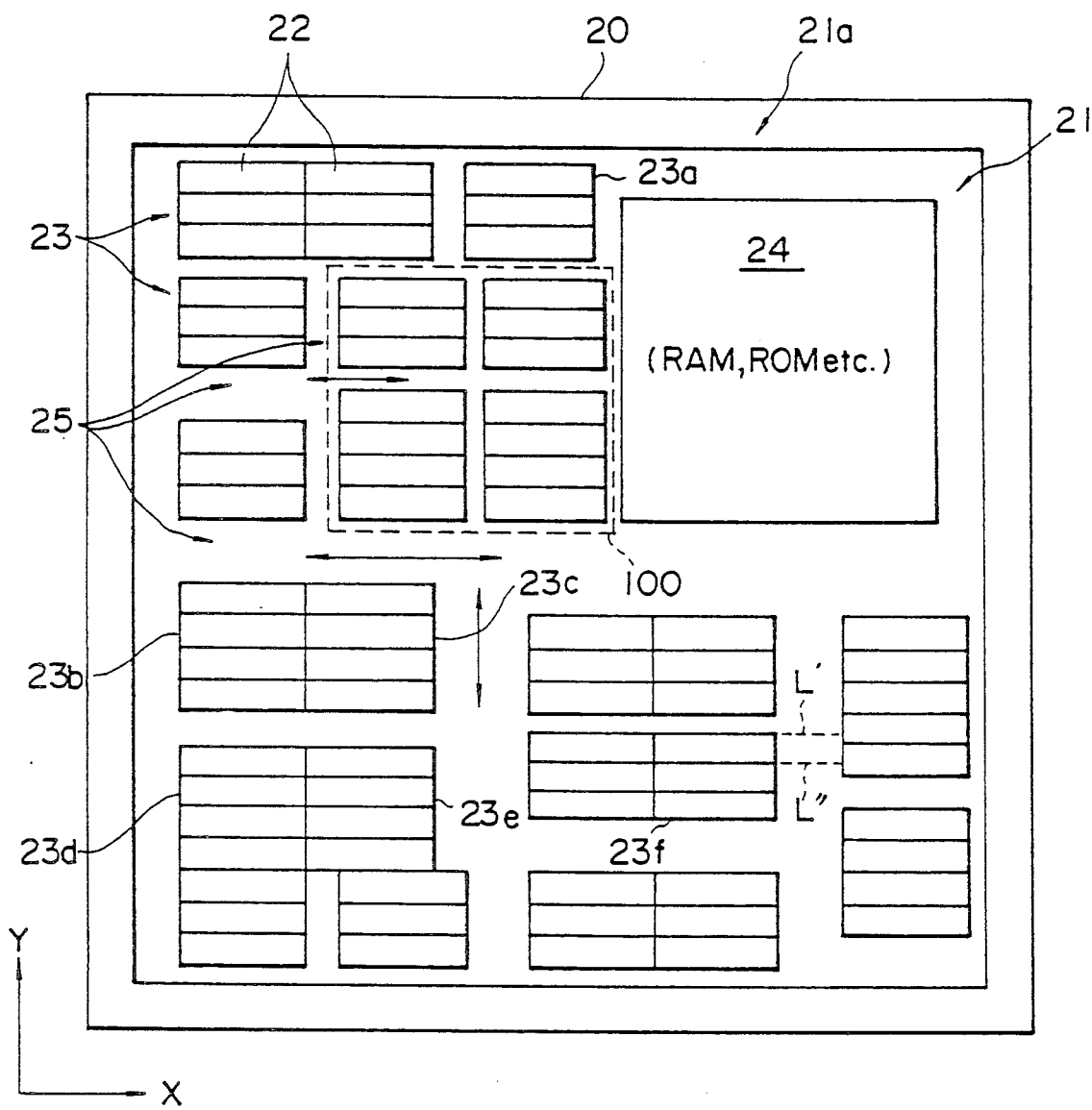
FIG. 9 is a plan view showing a layout pattern of the integrated circuit according to a first embodiment of the present invention.

Next, a first embodiment of the integrated circuit of the present invention will be described with reference to FIG. 9 showing an example of layout of unit blocks on a semiconductor chip 20.

Referring to FIG. 9, the chip 20 has a chip area 21 defined by an input/output region 21a which may include input/output buffer circuits and terminal pads, and a number of aggregation of unit blocks or minimacro blocks 23 each including a number of unit blocks 22 assembled therein, are disposed on the chip area 21. In each mini-macro block 23, note that a plurality of unit blocks 22 are arranged adjacent to each other in the Y-direction, and such that the short, lateral side edges of the unit blocks are aligned in the Y-direction. The number of unit blocks included in one mini-macro block 23 may be changed in each mini-macro block. In other words, the mini-macro block 23 may have various sizes in the Y-direction. On the other hand, the size of the mini-macro block 23 in the X-direction is identical throughout and agrees with the standardized size L of the unit block 22. Further, there may be provided a mega-cell region 24 of rectangular shape for function blocks such as RAM, ROM or ALU with a size increased as compared to the unit block 22. The minimacro block 23 may be divided into a plurality of minimacro blocks as desired whenever it is desired to have a space for interconnection.

The mini-macro blocks 23 are disposed on the chip 20 such that a number of channel regions 25 are formed between adjacent mini-macro blocks 23. In the embodiment of FIG. 9, the mini-macro blocks 23 are disposed freely on the chip area 21 except for the orientation such that the unit blocks 22 in the mini-macro blocks 23 extend always in the X-direction throughout the chip 20. Note that some of the mini-macro blocks 23 may be provided isolated from each other as in the case of a mini-macro block 23a while some other mini-macro blocks 23 are provided as a cluster of two or more mini-macro blocks 23 disposed adjacent to each other in the X-direction. For example, there are mini-macro blocks 23b and 23c or mini-macro blocks 23d and 23e disposed adjacent to each other. As shown in the case of mini-macro blocks 23d and 23e, the size of each of the adjacent mini-macro blocks does not necessarily have to be identical.

Further, the mini-macro blocks 23 are assembled and interconnected with each other to form a macro-block 100 which forms a completed functional block or unit of the chip such as ALU and the like. As already noted, a single mini-macro block 23 on the contrary does not usually have the function of such completed functional block.

One essential feature of the present invention is that there are a plurality of mini-macro blocks 23 in the X-direction with or without channel areas 25 intervening therebetween. In other words, there are more than two mini-macro blocks 23 disposed in the X-direction on a single chip area 21, and the position of these minimacro blocks 23 can be chosen freely. Further, the position in the Y-direction of the mini-macro blocks 23 is determined freely. Note that it is not always necessary that the mini-macro blocks 23 are aligned with each other such that the top edge and the bottom edge, shown respectively by legends L', L" of the unit block, therein agree with the corresponding top edge and bottom edge of the unit block in other, neighboring mini-macro block 23. The only constraint with respect to the arrangement of the mini-macro block 23 and thus the arrangement of the macro-block 100 is that the direction of the unit blocks must be the same throughout the mini-macro blocks 23 and thus throughout the macro-blocks 100 on the chip area 21.

In each of the unit blocks 22, the interconnection between the polycells 22a is completed except for terminals for connection to other polycells in other unit blocks 22. Further, in each of the mini-macro blocks 23, the interconnection between the unit blocks 22 included therein is completed except for terminals for connection to other unit blocks 22 in other mini-macro blocks 23. Thus, the interconnections critical to the operational speed of the ECL gate is confined within each unit block and thus within each mini-macro block 23 with a minimized length, and thereby a maximum operational speed is guaranteed for the integrated circuit. The other interconnections for connecting unit blocks 22 belonging to different mini-macro blocks 23 are provided using a space called channel area or global channel 25 formed between the mini-macro blocks 23.

In the global channel 25, no terminal or other structure which obstructs the passage of interconnection conductors is provided and thus, an effective interconnection between different mini-macro blocks 23 is achieved. Further, as the passage for the interconnections just passing through the mini-macro blocks 23 without being connected therewith is provided outside of the mini-macro blocks 23, no space or feed-through path is needed inside the mini-macro block 23 for passage of such interconnections, and the integration density of the integrated circuit can readily be maximized.

Figure 10B:
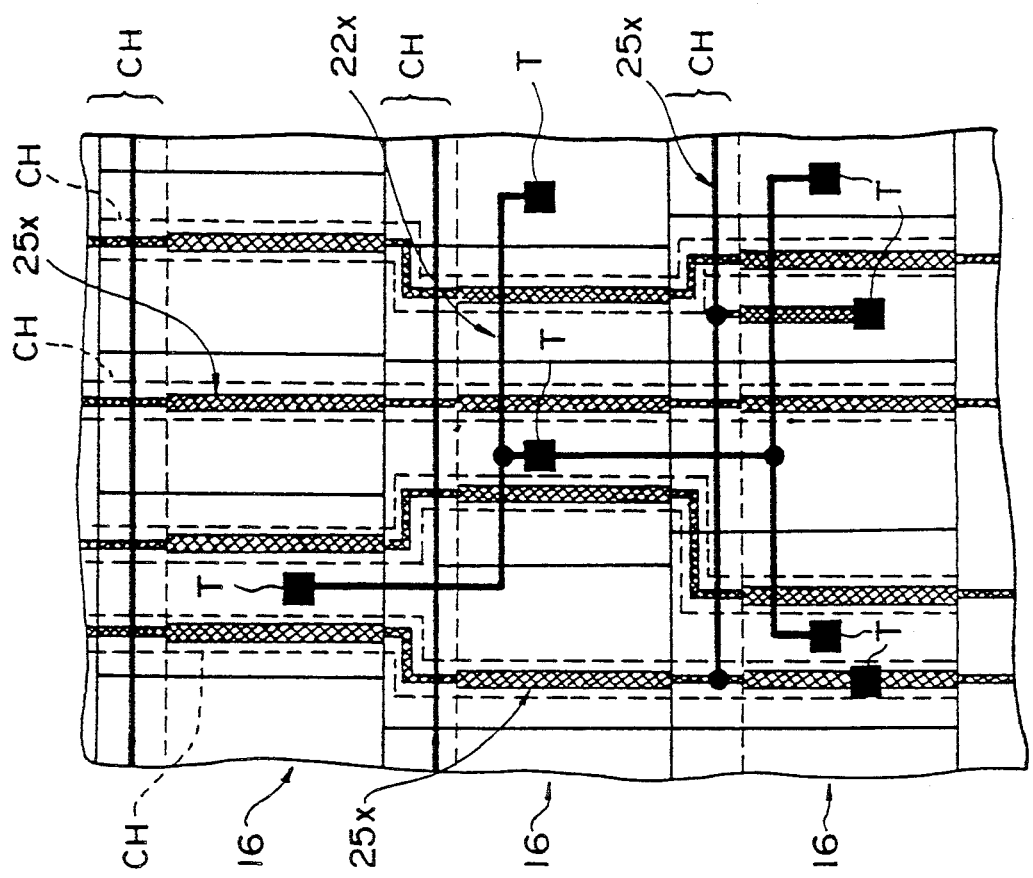
FIG. 10B is a plan view showing the interconnection pattern used in the prior art integrated circuit having the polycell structure for the purpose of comparison with the interconnection pattern of the present invention.
Figure 10A:
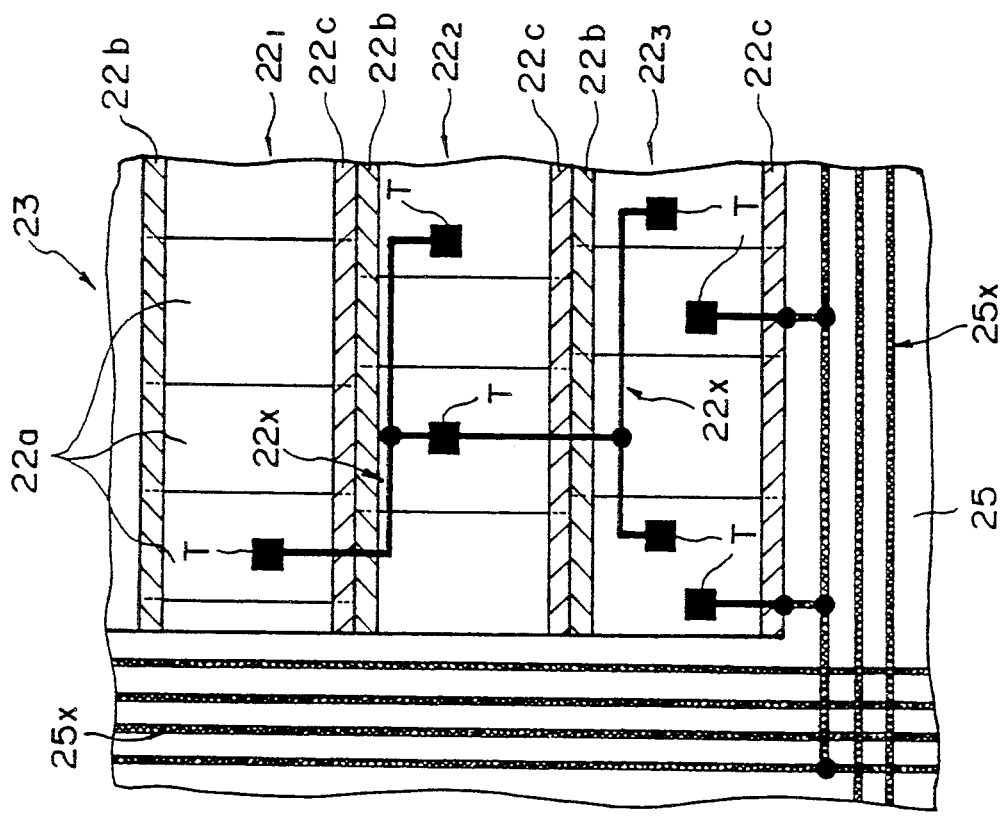
FIG. 10A is a plan view showing the interconnection pattern used in the integrated circuit of the present invention.

FIG. 10A shows an example of interconnections provided in the integrated circuit of the present invention. Referring to the drawing, the integrated circuit comprises a number of unit blocks $22_1$, $22_2$, $22_3$, etc. forming the mini-macro blocks 23, and the global channel 25 is formed between the adjacent mini-macro blocks 23. In each of the polycells 22a forming the unit blocks, the interconnection is completed by conductor patterns not illustrated at a first level below the level of the power conductors 22b and 22c, and a terminal T is provided for interconnection to other polycells 22a. These terminals T formed in the polycells 22a in the unit blocks $22_1$, $22_2$, $22_3$ are connected to each other by an interconnection conductor pattern 22x provided at a third level above the level, or a second level, of the power conductors 22b and 22c. Note that the conductor pattern 22x is used for interconnection which is critical to the high speed operation of the integrated circuit. On the other hand, there is provided another interconnection pattern 25x in correspondence to the global channel 25 at the first or second level for the interconnection between the polycells 22a that belong to different mini-macro blocks 23. This interconnection pattern 25x is used for the interconnections less critical to the high speed operation of the integrated circuit. In other words, the polycells 22a forming the logic circuits which are critical to the high speed operation of the integrated circuit are assembled close to each other in each mini-macro block 23 at the time of designing the arrangement of the unit blocks $22_1$, $22_2$, $22_3$.

By constructing the unit blocks 22 and the mini-macro blocks 23 as such, the foregoing advantages of the high speed operation and the free layouting of the integrated circuit are achieved.

FIG. 10B shows a typical example of interconnection provided in the conventional CMOS or MOS integrated circuits having the polycell structure, for the purpose of comparison.

Figure 1:
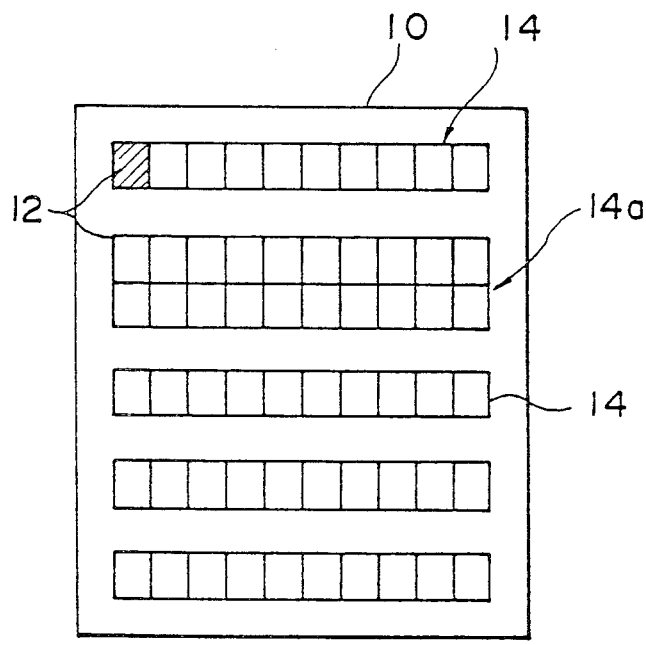
FIG. 1 is a plan view showing a typical gate array structure used in conventional logic integrated circuits.
Figure 2:
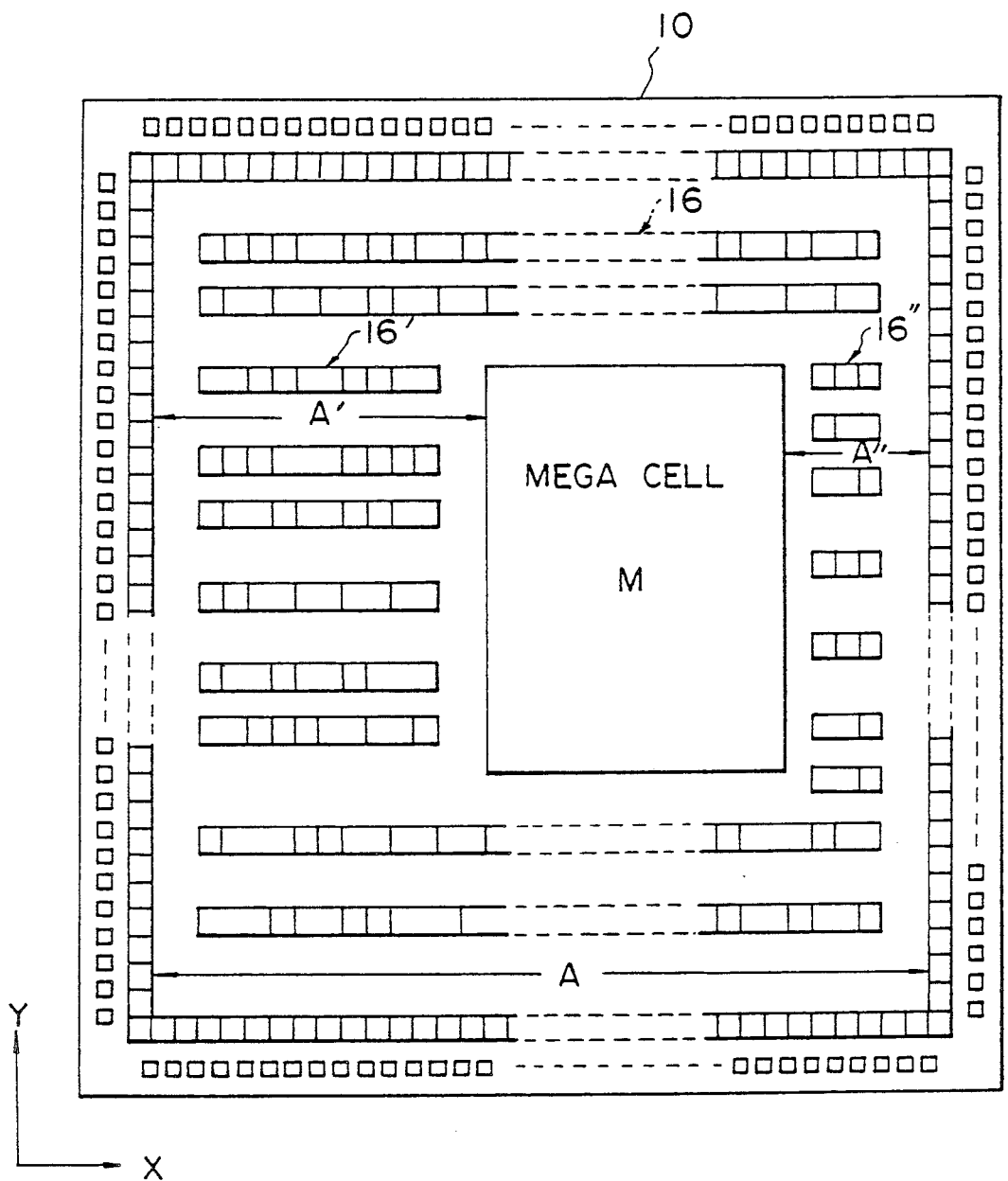
FIG. 2 is a plan view showing a typical example of a prior art polycell structure used in the conventional logic integrated circuit constructed by MOS or CMOS devices.
Figure 3:
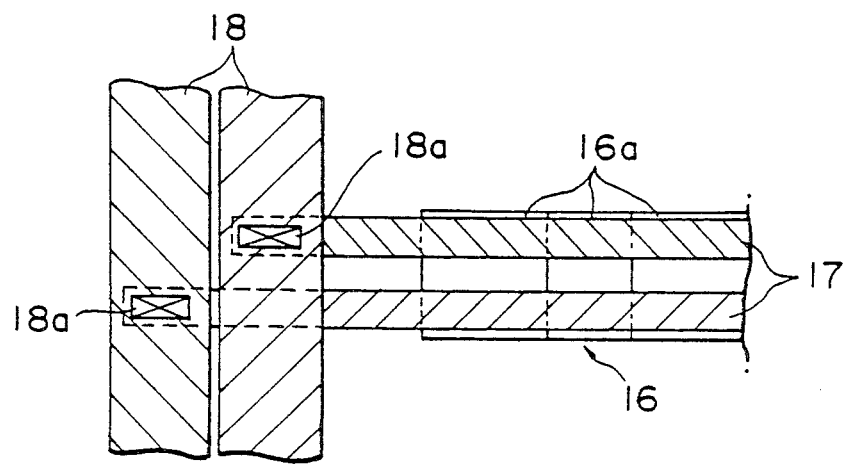
FIG. 3 is an enlarged view showing the interconnection of power conductors to power terminals in the case of conventional integrated circuits constructed by MOS or CMOS devices.

In such an integrated circuit, the polycells are arranged into a number of polycell columns 16 as already described with reference to FIG. 2, and the interconnection is achieved by using the interconnection patterns 22x for interconnection of polycells adjacent to each other as well as using the interconnection patterns 25x for connecting polycells which are separated from each other for a relatively long distance. It should be noted that, in order to pass the interconnection patterns 25x, each of the polycells in the polycell column is formed with a feed through channel region CH which occupies a substantial area of the polycell. Note that FIGS. 10A and 10B are drawn with substantially the same scale. This means that the integration density of each of the polycells is unnecessarily decreased just for passage of the interconnection patterns 25x which are not connected thereto, and the operational speed of the integrated circuit is deteriorated in this conventional case. Further, as a result of provision of the feed through channel region CH, the length of the interconnection 22x is also increased, thus causing further decrease of the operational speed.

As the unit blocks 22 have a standardized size in the X-direction and as the mini-macro blocks 23 have a size equals to the integer multiple of the standardized size in the X-direction, the design and layout of the macro-blocks 100 can be performed efficiently by automatic design procedure such as CAD. In other words, the design of integrated circuit using the concept of unit blocks 22 and macro-blocks 100 formed from the unit blocks 22 in the form of an assembly of mini-macro blocks 23 as disclosed in the present invention is suited for application of automatic design procedure. It should be noted that this structure of the present invention enables the application of a hierarchical CAD method, wherein the timing as well as layout designing of the integrated circuit can be performed in different hierarchical levels, one hierarchical level corresponding to the layout inside the macro-blocks 100, and the other hierarchical levels for the mutual layout of the individual macro-blocks 100. By separating the designing process as such, various advantageous features such as the minimization of layout correction, early feedback to the logic as well as timing simulation, reduction of the computer load for designing, and the like are achieved as will be described. As the layout of the mini-macro blocks 23 can be performed substantially freely, megacell structures 24 such as RAM, ROM or ALU can be provided at any desired location on the chip area 21.

It should be noted that the electric power needed in a unit area on the chip 20 is maintained almost constant when the integrated circuit is constructed using the unit blocks 22 or mini-macro blocks 23 of the present invention. This means that whatever the arrangement of the mini-macro blocks 23 may be on the chip area 21, the average electric power to be fed into a unit area of the chip area 21 remains substantially constant as long as the unit blocks 22 are distributed substantially uniformly over the chip area 21. This in turn means that feeding of electric power to the integrated circuit can be achieved using a fixed power feed system. Various examples of such a fixed power feed system will be described later.

Figure 11:
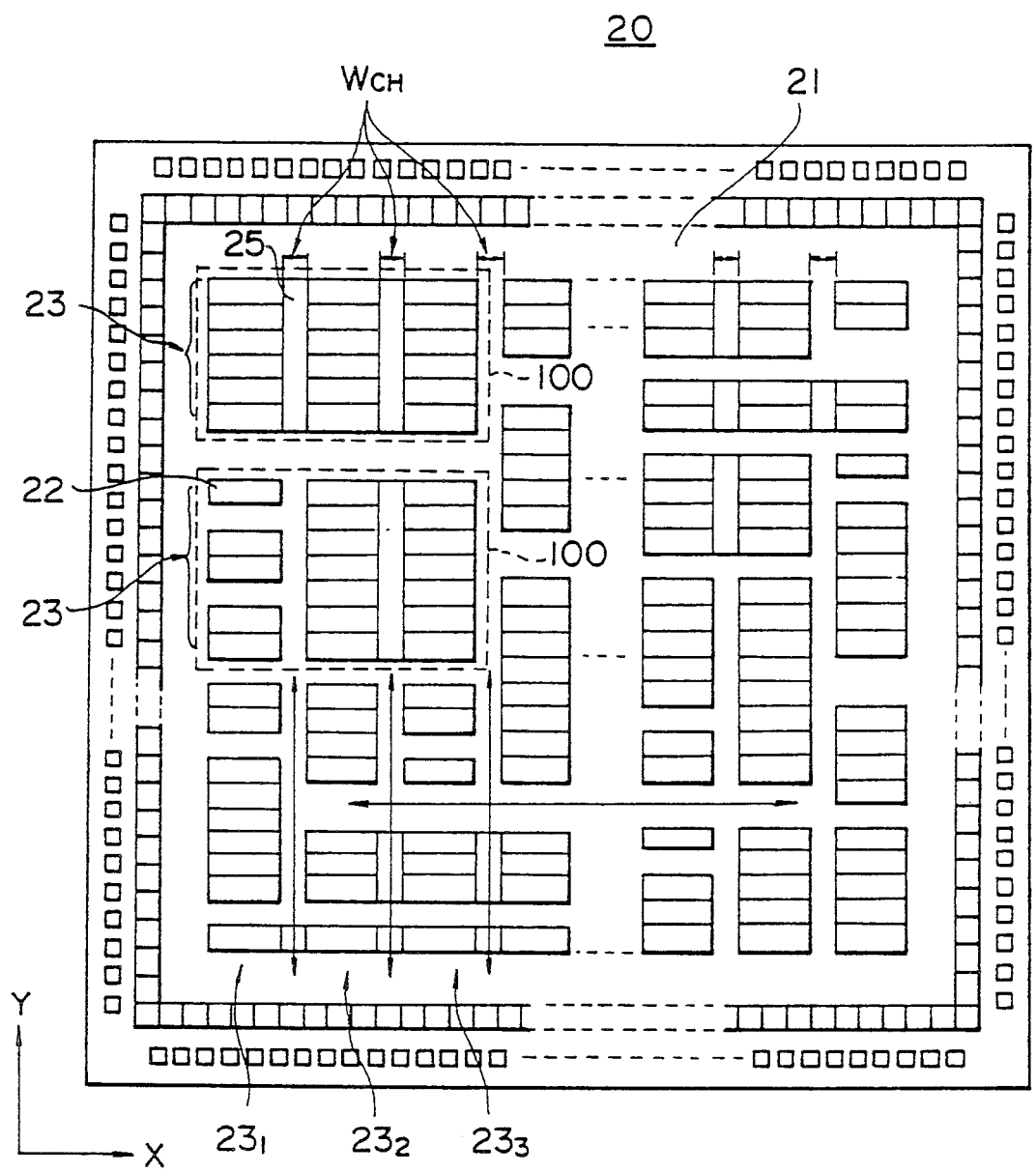
FIG. 11 is a plan view showing a layout pattern of the integrated circuit according to a second embodiment of the present invention.

FIG. 11 shows a second embodiment wherein the global channel 25 formed between a pair of mini-macro blocks 23 has a constant width $W_{CH}$ throughout the chip area 21 and the global channel 25 extends straight in the Y-direction throughout the chip area 21. In other words, a number of mini-macro blocks 23 are arranged into a group of mini-macro block columns $23_1$, $23_2$, $23_3$, and the like, each extending straight in the Y-direction. In each of the mini-macro block columns $23_1$, $23_2$, $23_3$, one or more mini-macro blocks 23 having various sizes in the Y-direction are included. There may be isolated unit blocks also in the mini-macro block column. Such a regular layout of mini-macro block columns $23_1$, $23_2$, $23_3$ makes it possible to use a regular power feed pattern which is extremely advantageous for feeding a large electric power. In the following description, feeding of electric power to the integrated circuit will be described.

Figure 12A:
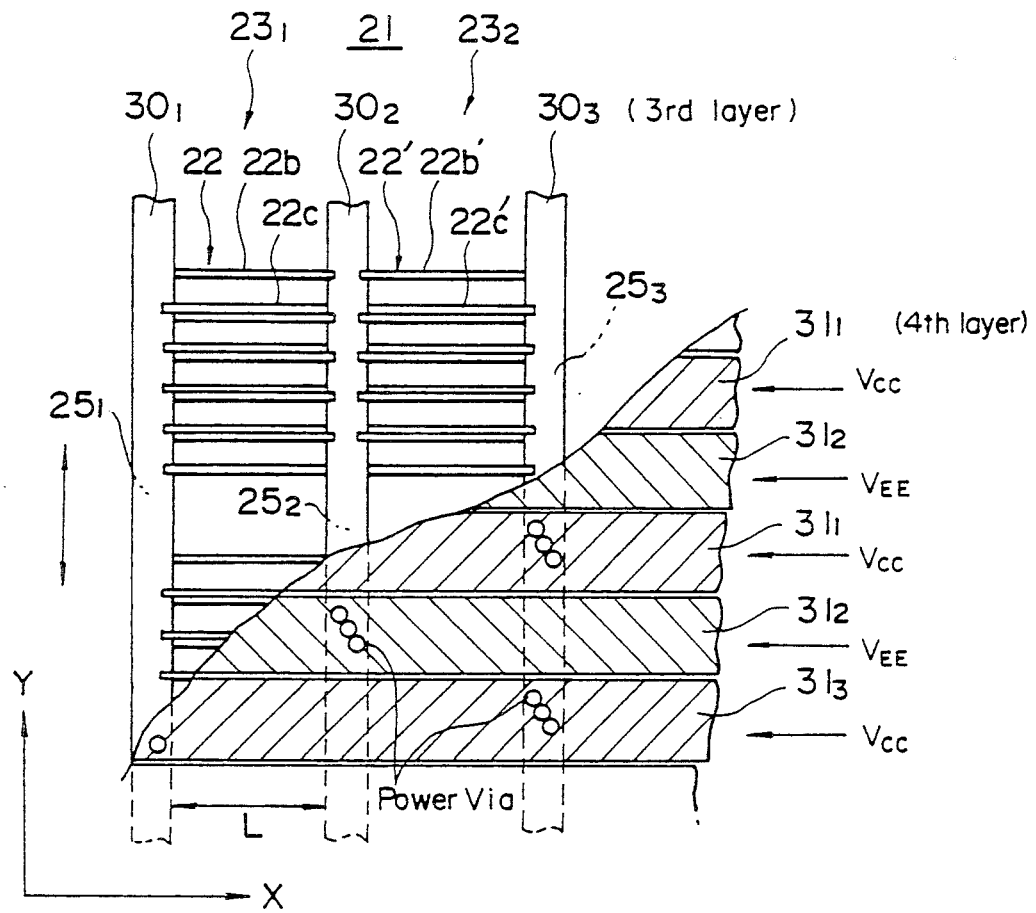
FIG. 12A is an enlarged view showing an example of interconnection of power conductors in the integrated circuit of FIG. 11.
Figure 12B:
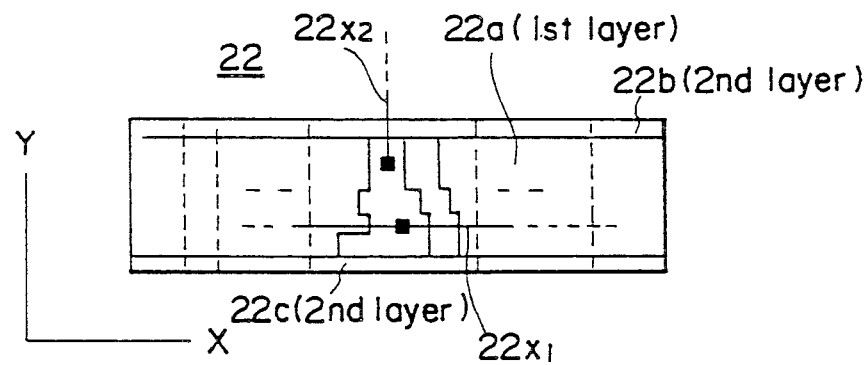
FIG. 12B is an enlarged view showing an example of the unit block in FIG. 12A.

FIG. 12A shows a construction of power feed system for feeding the electric power in the case of the second embodiment shown in FIG. 11 wherein there are a number of parallel, straight global channels 25 repeated with a predetermined interval equal to the length L of the unit blocks 22. Referring to FIG. 12A, power buses $30_1$, $30_2$, $30_3$, etc. are provided in correspondence to global channels $25_1$, $25_2$, $25_3$ and the like, and these power buses are connected commonly to the corresponding power conductors 22b and 22c of the unit blocks 22 included in the mini-macro block columns $23_1$, $23_2$, and the like at the intersections to these power conductors. The power conductors 22b and 22c are provided at the second level above the first level used for interconnections completing within the unit block 22 as shown schematically in FIG. 12B while the power buses $30_1$, $30_2$ and $30_3$ are provided at the third level above the second level. In FIG. 12B, an interconnection conductor $22x_1$ extending in the X-direction and another interconnection conductor $22x_2$ extending in the Y-direction are also shown. These interconnection conductors $22x_1$ and $22x_2$ form the foregoing conductor pattern 22x, wherein the conductor $22x_1$ is provided at the second level and the conductor $22x_2$ is provided at the third level.

Thus, the power buses $30_1$ and $30_2$ are connected respectively to the power conductors 22b and 22C of one unit block 22 and the power buses $30_2$ and $30_3$ are connected respectively to the power conductors 22b' and 22c' of an adjacent unit block 22'. Further, the power buses $30_1$–$30_3$ are supplied with electric power corresponding to the source voltages $V_{CC}$ and $V_{EE}$ from main power buses $31_1$ and $31_2$ provided at a fourth level so as to extend in the X-direction alternately, through power via-holes Power Via at the intersection of power buses and the main power buses. Note that the first, second, third and fourth level conductors are separated from each other by insulator layers not illustrated. By providing the main power buses $31_1$ and $31_2$ as an alternating repetition of conductor strips arranged side by side as shown in FIG. 12A, the fourth level of the conductor layer on the chip is covered substantially completely by the main power buses and an extremely powerful power feed system is constructed. Note that any of the unit blocks 22 on the chip 20 is connected to a suitable pair of the power buses $30_1$, $30_2$, $30_3$, . . . wherever it may be provided on the chip area 21 and supply of sufficient electric power is guaranteed. Although the illustrated construction is for feeding the source voltages $V_{EE}$ and $V_{CC}$, the present power feed system can be easily modified to the case where three or more source voltages are supplied by increasing the number of power buses or power conductors in each level of conductor layers.

It should be noted that by providing the power buses $30_1$–$30_3$ in correspondence to the global channels $25_1$–$25_3$ at the third level as described, the first level of the global channels can be used freely for interconnection 25x (FIG. 10A) between the polycells in the different mini-macro blocks 23 and the degree of freedom for designing the integrated circuit is substantially increased. Further, interconnections between different unit blocks 22 in a single mini-macro block 23 can be made freely by providing interconnection conductors 22x (FIG. 10A) extending in the Y-direction at the second level. The pitch of repetition of the power buses $30_1$–$30_3$ in the X-direction is set slightly larger than the size L of the unit block 22 in correspondence to the pitch of repetition of the global channels $25_1$–$25_3$ which is equal to the sum of the size L and the width $W_{CH}$ of the global channels.

Next, a power feed system for a more general case of layouting the mini-macro blocks 23 will be described with reference to FIG. 13. Referring to the drawing showing a typical arrangement of the mini-macro blocks for this case, the mini-macro blocks 23 and 23' are arranged adjacent to each other in the Y-direction with a mutual offset in the X-direction. Thus, the global channels 25 at both sides of the mini-macro blocks 23 and 23' extend no longer straight throughout the chip area 21.

Figure 13:
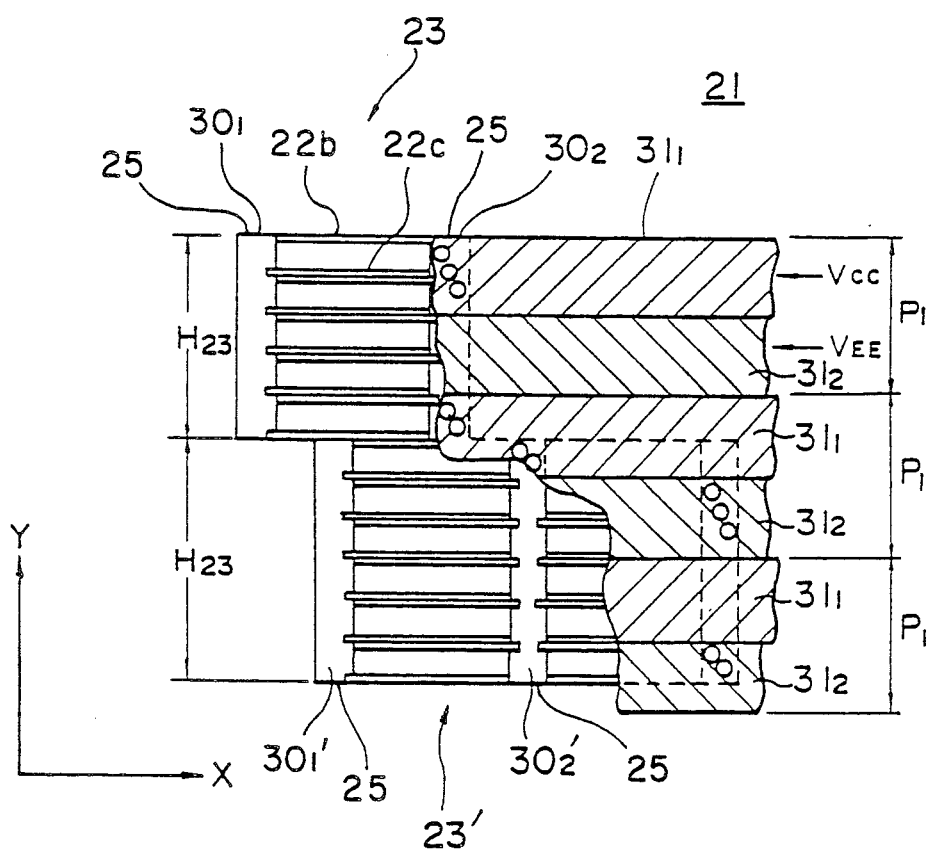
FIG. 13 is an enlarged view showing another example of interconnection of power conductors in the integrated circuit of FIG. 9 showing the first embodiment.

In such a case, power buses are provided in correspondence to each area 25 between a pair of mini-macro blocks 23, 23' and the like as shown in FIG. 13 by power buses $30_1$, $30_1'$, $30_2$, $30_2'$ and the like, and feeding of the electric power is made to these power buses from the main power buses $31_1$ and $31_2$ which are provided in the X-direction similarly to the case of FIG. 12A. In order to secure the reliable feeding of electric power to any of the mini-macro blocks 23, 23' in the chip area 21 from a fixed power feed system, the pitch of repetition P1 of the main power buses $31_1$ and $31_2$ is set smaller than the minimum height $H_{23}$ of the mini-macro blocks existing in the chip area 21. Note that the pitch P1 is the sum of the width of the conductor strips forming the main power bus $31_1$ and the main power bus $31_2$. As the layout of the power feed system is fixed, the layout process of mini-macro blocks 23 on the chip area 21 can be performed freely and efficiently by CAD without particular consideration about the power feed system. Thereby, detailed design such as routing of wiring conductors becomes substantially easier.

Figure 14:
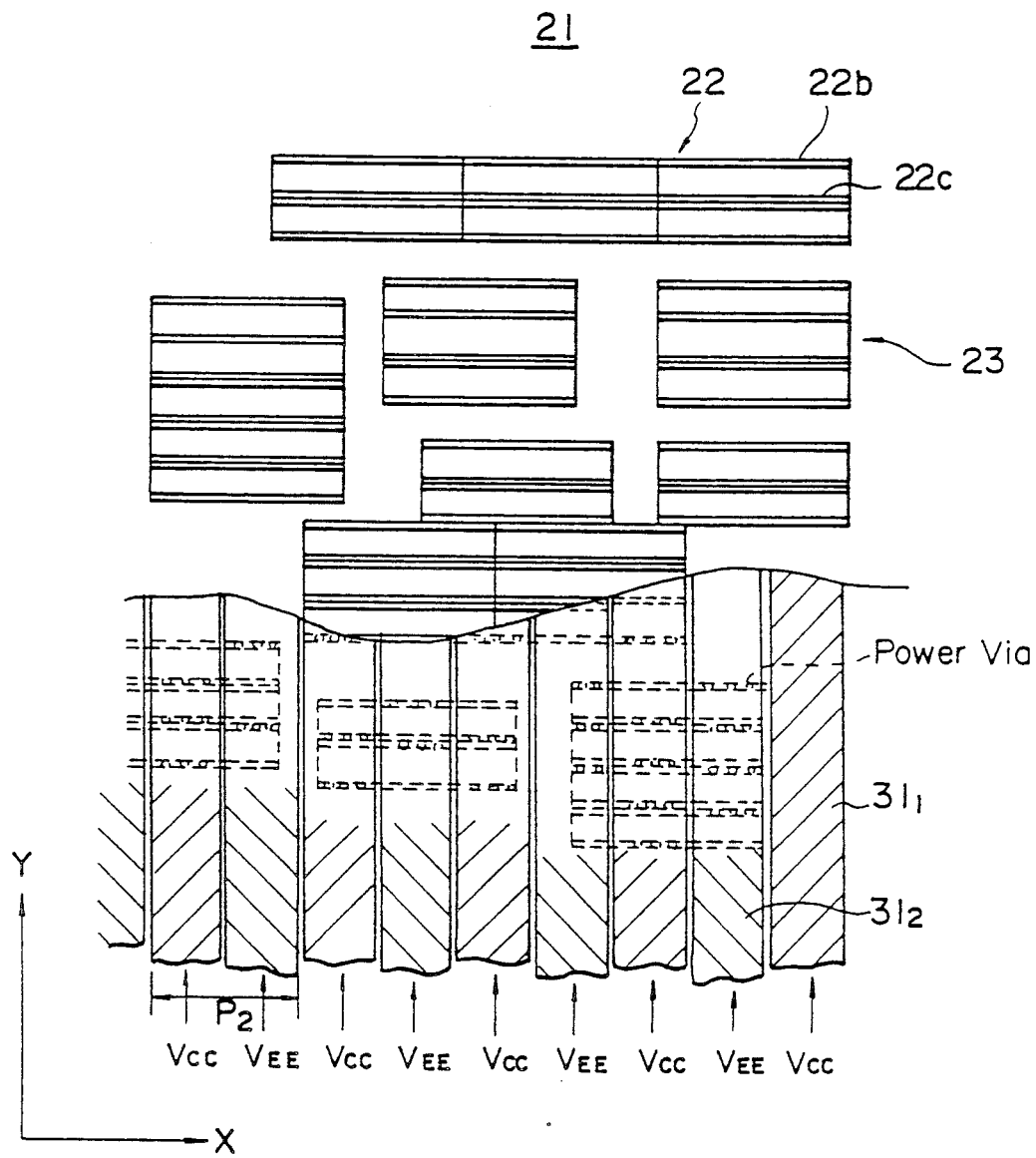
FIG. 14 is a plan view showing an example of another layout pattern and interconnection of power conductors in the integrated circuit of FIG. 9 showing the first embodiment of the present invention.

FIG. 14 shows another example of power feed system. This example corresponds to the case where the mini-macro blocks 23 are disposed freely on the chip area 21 as in the case of the first embodiment shown in FIG. 9, and the main power buses $31_1$ and $31_2$ are provided in the Y-direction. The power buses $30_1$ and $30_2$ are eliminated and the main power buses $31_1$ and $31_2$ make a direct contact to the power conductors 22b and 22c of the unit blocks 22. By arranging the main power buses $31_1$ and $31_2$ side by side throughout the chip area 21 and repeating with a pitch P2 set substantially smaller than the length L of the unit block 22, any one of the unit blocks in the mini-macro blocks 23 is crossed by a pair of main power buses $31_1$ and $31_2$ wherever the mini-macro blocks may be provided, and feeding of electric power to any of the unit blocks 22 in any of the mini-macro blocks 23 can be achieved through power via-holes Power Via shown in FIG. 14.

Figure 15:
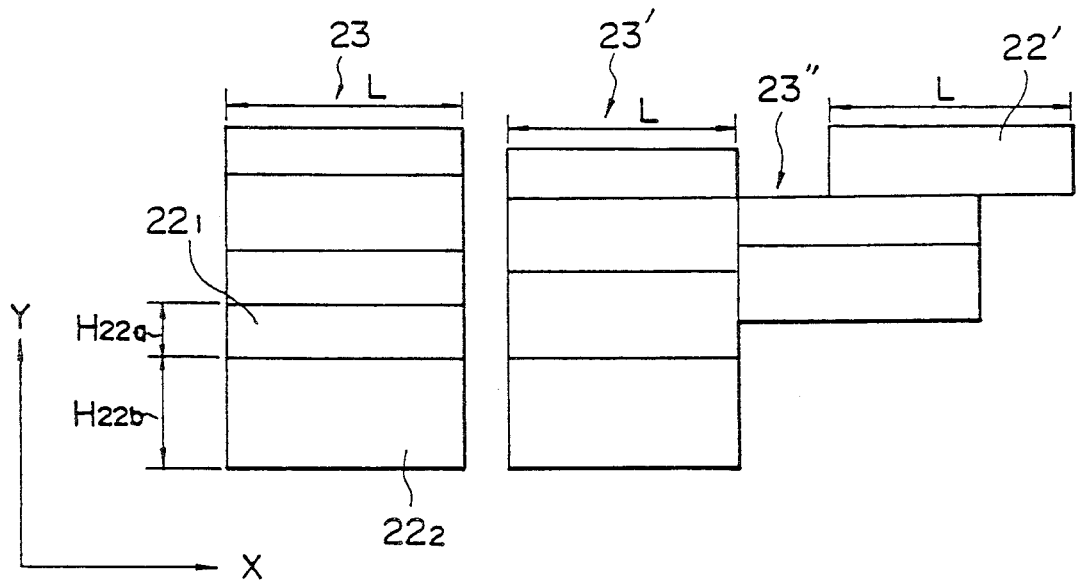
FIG. 15 is an enlarged plan view showing a layout pattern of the integrated circuit according to a third embodiment of the present invention.

FIG. 15 shows a third embodiment of the integrated circuit wherein different types of unit blocks $22_1$ and $22_2$ having different standardized heights $H_{22a}$, $H_{22b}$ are provided on the chip area 21 to form various mini-macro blocks 23, 23', 23" and the like. There may be even isolated unit blocks 22 not forming the mini-macro blocks. For the simplicity of the drawing, the power conductors at the top and bottom edges of the unit blocks are omitted from illustration. Such a construction is preferred when various different type of polycells different in the function and size have to be used in one chip.

In this embodiment, the polycells are classified into a number of groups each having respective heights H such as height $H_{22a}$, $H_{22b}$ and the unit block is constructed by assembling polycells having a common height. Thus, there appear several different types of unit blocks $22_1$, $22_2$ having respective heights, although the length L of the unit block in the X-direction is maintained constant. By assembling the unit blocks thus defined into mini-macro blocks 23 or 23', the layout process can be performed easily by CAD. Even in this case, it should be noted that the power density or electric power to be supplied to a unit area on the chip is maintained substantially constant. Thus, the power feeding systems described with reference to FIGS. 13 and 14 are effective also in this case.

Figure 16:
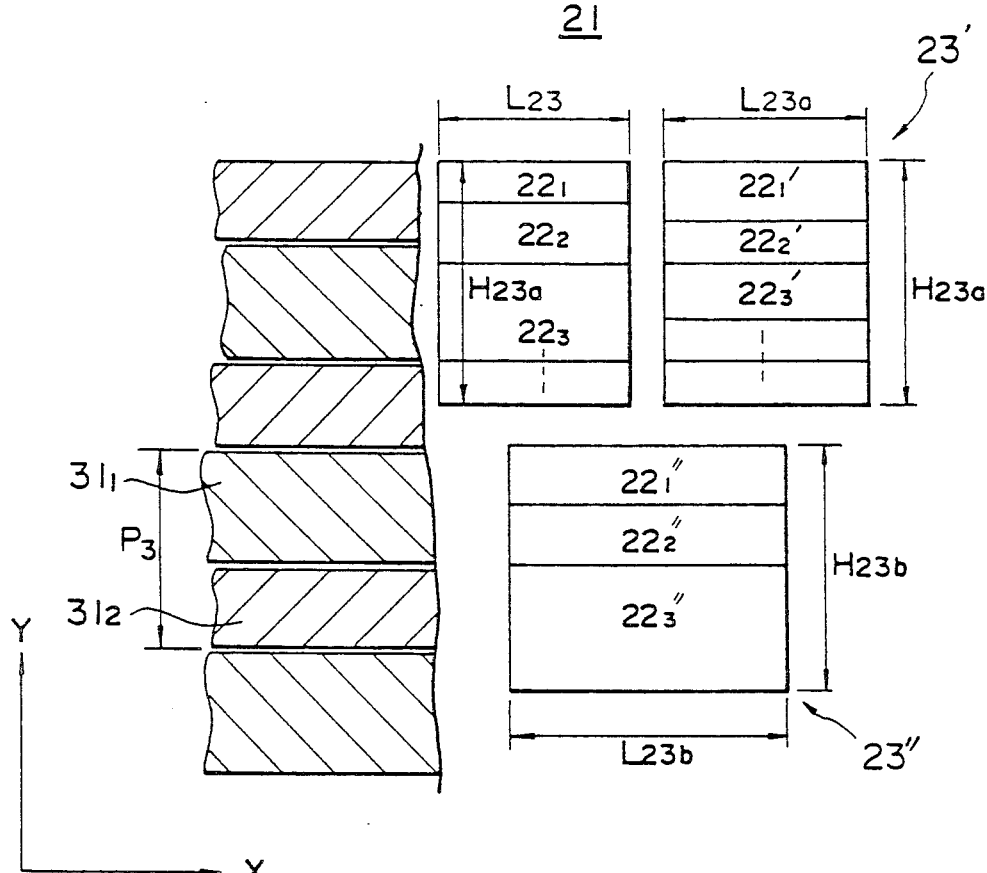
FIG. 16 is an enlarged plan view showing a layout pattern of the integrated circuit together with a pattern of power conductors according to a fourth embodiment of the present invention.

FIGS. 16 shows a fourth embodiment of the integrated circuit according to the present invention. Similarly to the case of FIG. 15, illustration of the parallel power conductors 22b, 22c will be omitted. In this embodiment, the degree of freedom about the size of the unit blocks is further increased such that the size measured in the X-direction of the unit blocks can be optimized in each unit block. Similarly to the case of FIG. 15, each of the polycells in one unit block has a same height H in the Y-direction but this height may vary when the unit block is different. In this embodiment, different types of mini-macro blocks 23, 23' and 23" having respective lengths in the X-direction are formed by assembling unit blocks $22_1$, $22_2$, $22_3$, $22_1'$, $22_2'$, $22_3'$, $22_1''$, $22_2''$, $22_3''$ having various lengths in the X-direction and various heights in the Y-direction according to the length. Note that the unit blocks $22_1$, $22_2$, $22_3$ have a same length $L_{23}$ throughout, the unit blocks $22_1'$, $22_2'$, $22_3'$, have a same length $L_{23a}$ throughout, and the unit blocks $22_1''$, $22_2''$, $22_3''$ have a same length $L_{23b}$ throughout. The mini-macro block units 23, 23' and 23" have respective heights $H_{23}$, $H_{23a}$ and $H_{23b}$ which may be different from each other. In the illustrated example, the height $H_{23}$ of the mini-macro block unit 23 and the height $H_{23a}$ of the mini-macro block unit 23' are identical to each other while the height $H_{23b}$ of the mini-macro block unit 23" is different.

FIG. 16 further shows an example of power feeding system applied to this embodiment. This power feeding system is also applicable to the embodiment of FIG. 15. The power feeding system is substantially identical to that of FIG. 13 wherein two different main power buses $31_1$ and $31_2$ are provided parallel and adjacent to each other in the X-direction. In this power feeding system, the pitch of repetition of the power buses $31_1$ and $31_2$ is set to a value P3 which satisfies a relation:

$$P3 < H_{23a}$$

$$P3 < H_{23b}$$

In other words, the pitch P3 is set smaller than the minimum height of the mini-macro block unit. in the chip. By setting the pitch as such, any one of the mini-macro blocks is supplied with the power from a pair of main power buses $31_1$ and $31_2$.

Figure 17:
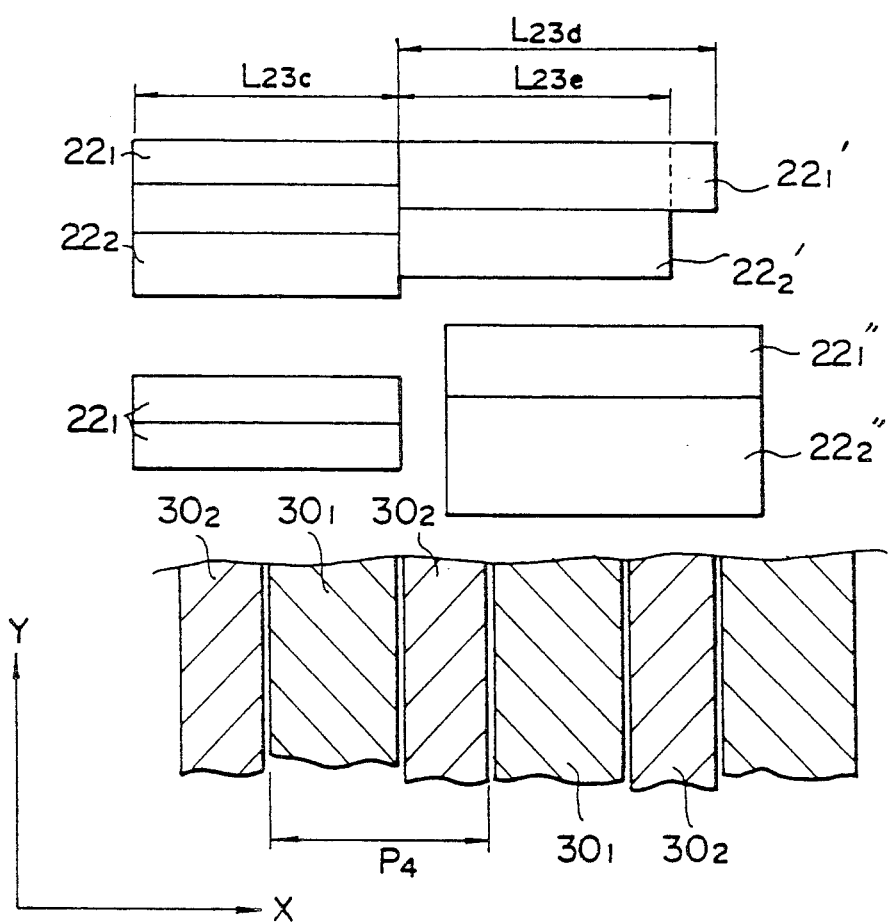
FIG. 17 is an enlarged plan view showing a layout pattern of the integrated circuit together with a pattern of power conductors according to a fifth embodiment of the present invention.

FIG. 17 shows a fifth embodiment of the present invention. In this embodiment, unit blocks having different sizes in the X-direction and different heights in the Y-direction are assembled freely to form the mini-macro blocks. In this case, therefore, the side edges of the mini-macro blocks in the Y-direction are not always straight. Even in such a case, fixed power feed system can be applied by arranging power buses $30_1$ and $30_2$ side by side in the Y-direction with a pitch of repetition P4 set smaller than the minimum length L of the unit blocks therein. In other words, the pitch P4 is set such that $$P4 < L_{23c}$$

$$P4 < L_{23d}$$

$$P4 < L_{23e}$$

$$\ldots$$

$$P4 < L_{min}$$

where $L_{23c}$, $L_{23d}$, $L_{23e}$ represent the size of the mini-macro blocks in the X-direction, and $L_{min}$ represents the minimum length of the unit block or mini-macro block unit in the X-direction existing on the chip.

Figure 18:
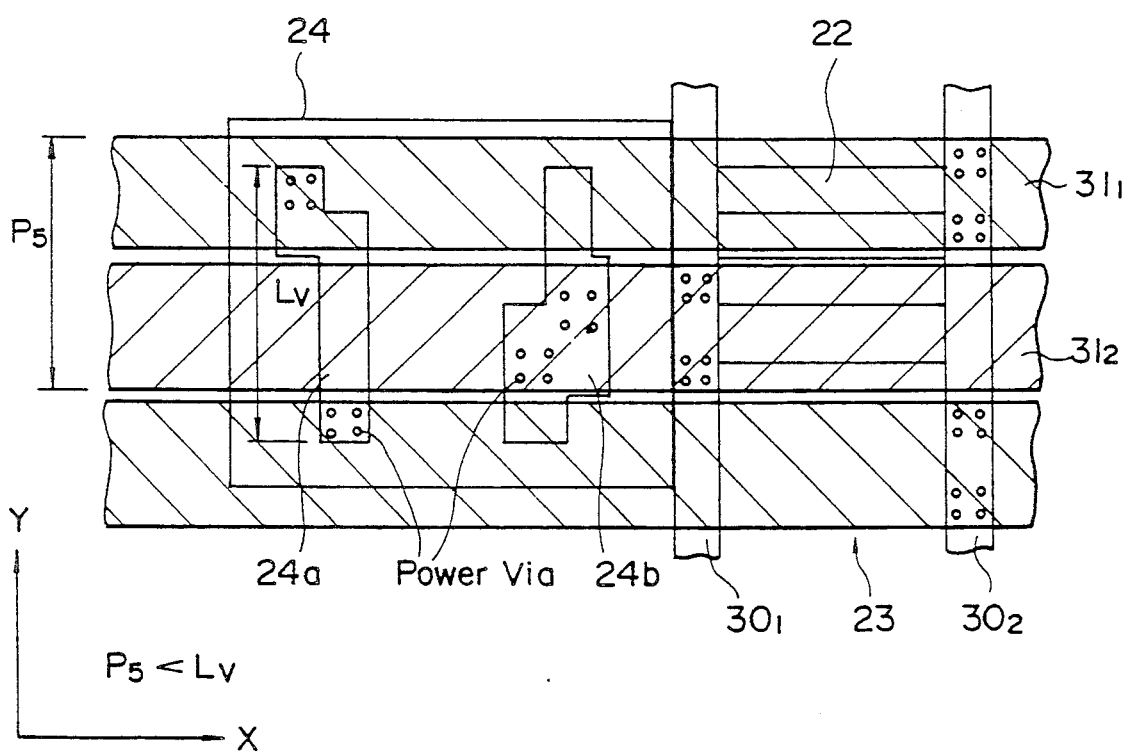
FIG. 18 is an enlarged view showing connection of power conductor patterns in the embodiment of FIG. 9.
Figure 19:
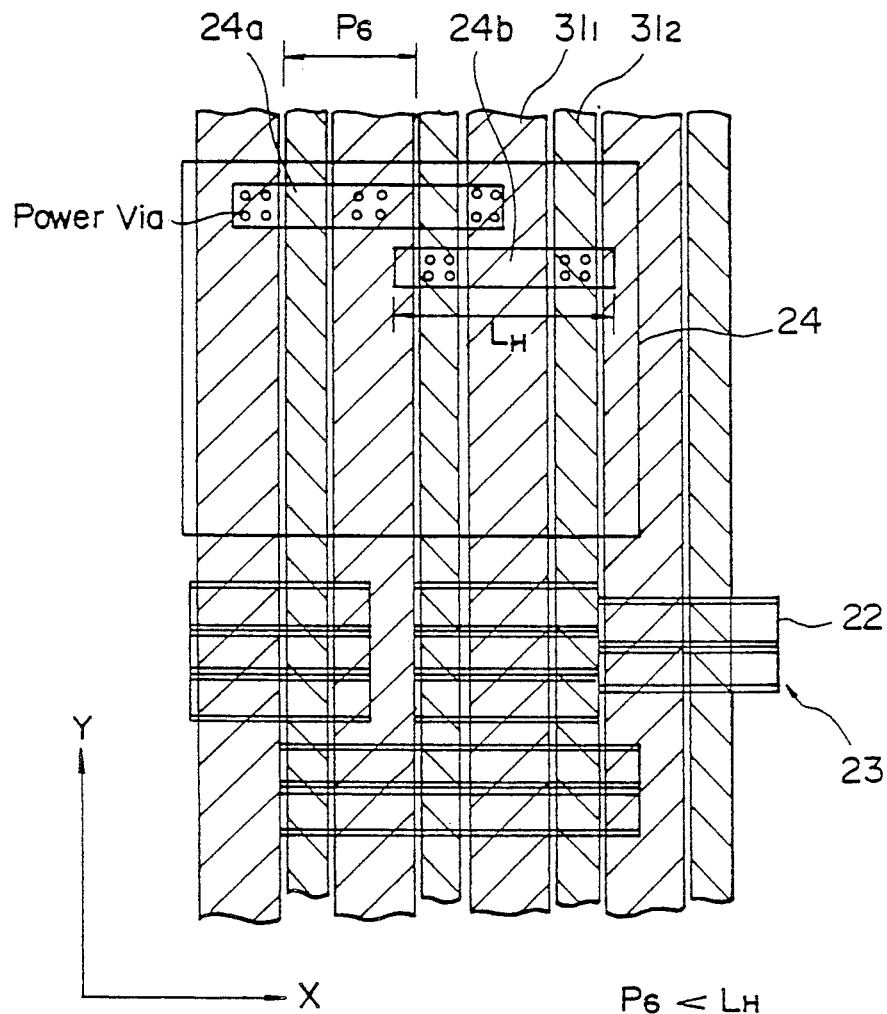
FIG. 19 is an enlarged plan view showing another connection of power conductor patterns in the embodiment of FIG. 9.

FIGS. 18 and 19 show the example of feeding electric power to the mega-cell 24 shown in FIG. 9.

Referring to FIG. 18, the power buses $30_1$ and $30_2$ are provided in correspondence to the global channels 25 at both sides of the mini-macro block units 23 similarly to the case of foregoing embodiments, and the feeding of electric power is made by providing the main power buses $31_1$ and $31_2$ in the X-direction similarly to the embodiments of FIGS. 12A, 13 and 16. The mega-cell 24 may form functional unit such as RAM, ROM or ALU as already described, and has a size substantially larger than that of the unit block 22.

In order to feed the electric power to each of the devices in the mega-cell 24, a power conductor 24a and a power conductor 24b are provided on the mega-cell 24 generally in the Y-direction and the electric power is fed to the mega-cell 24 through power via-holes at the intersection of the power conductors 24a, 24b and the power buses $31_1$ and $31_2$. By setting the pitch of repetition of the power buses $31_1$ and $31_2$ in the direction Y to a pitch P5 which is equal to or smaller than the length $L_V$ of the power conductors 24a and 24b measured in the Y-direction, the electric power can be supplied reliably to the power conductors 24a and 24b from the power buses $31_1$ and $31_2$ wherever the mega-cell 24 may be provided on the chip area 21.

FIG. 19 shows a case for feeding the electric power to the mega-cell 24 from power buses $31_1$ and $31_2$ extending in the Y-direction through power conductors 24a and 24b which are now extending in the X-direction. By setting the length $L_H$ of the power conductors 24a and 24b measured in the X-direction to be equal to or larger than the pitch of repetition of the power buses $31_1$ and $31_2$ in the X-direction represented by a pitch P6, the electric power can be fed to the mega-cell 24 wherever the mega-cell 24 may be provided on the chip area 21.

Figure 20A:
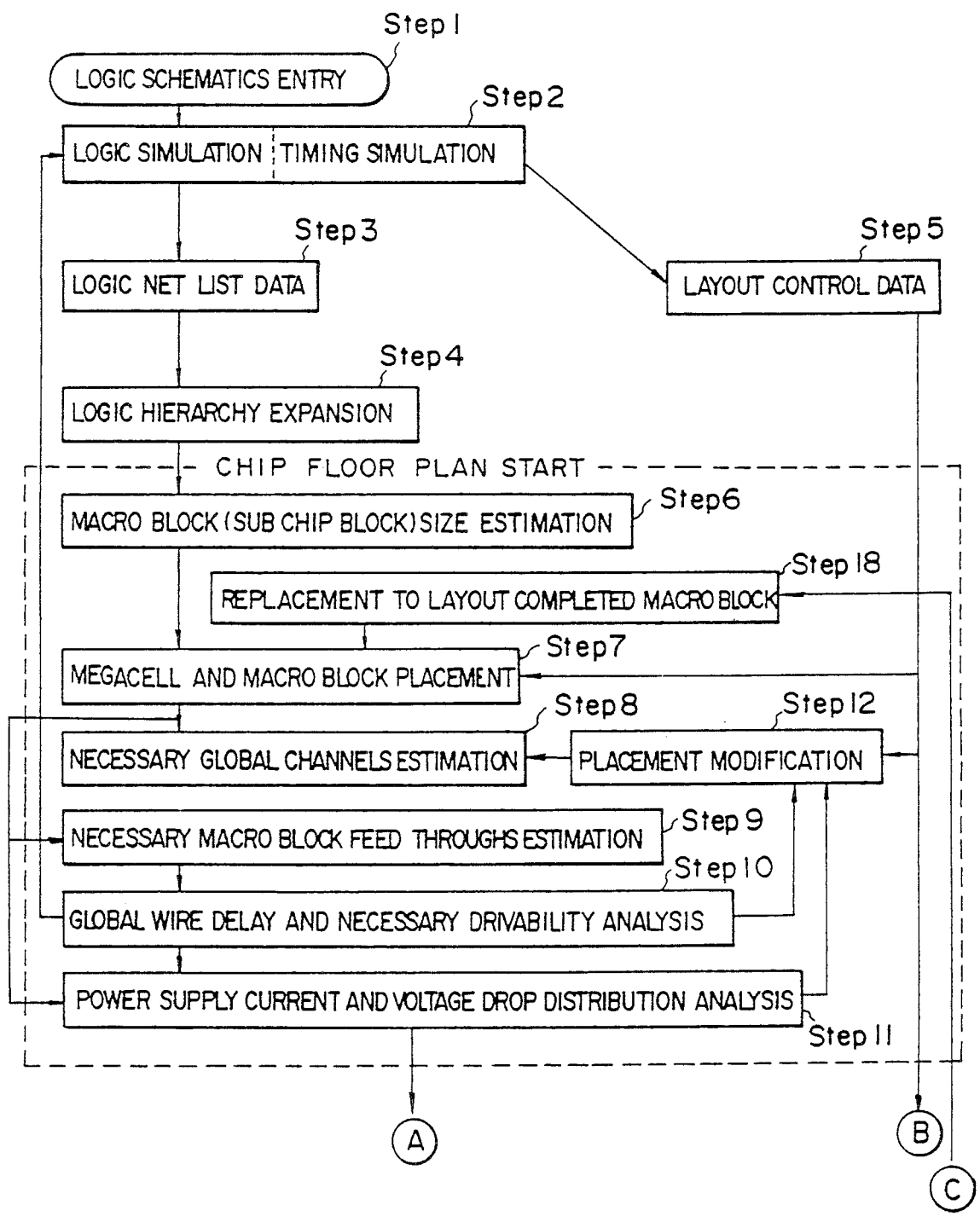
FIGS. 20A and 20B are flow charts showing a layout process applied to the semiconductor integrated circuit of the present invention.
Figure 20B:
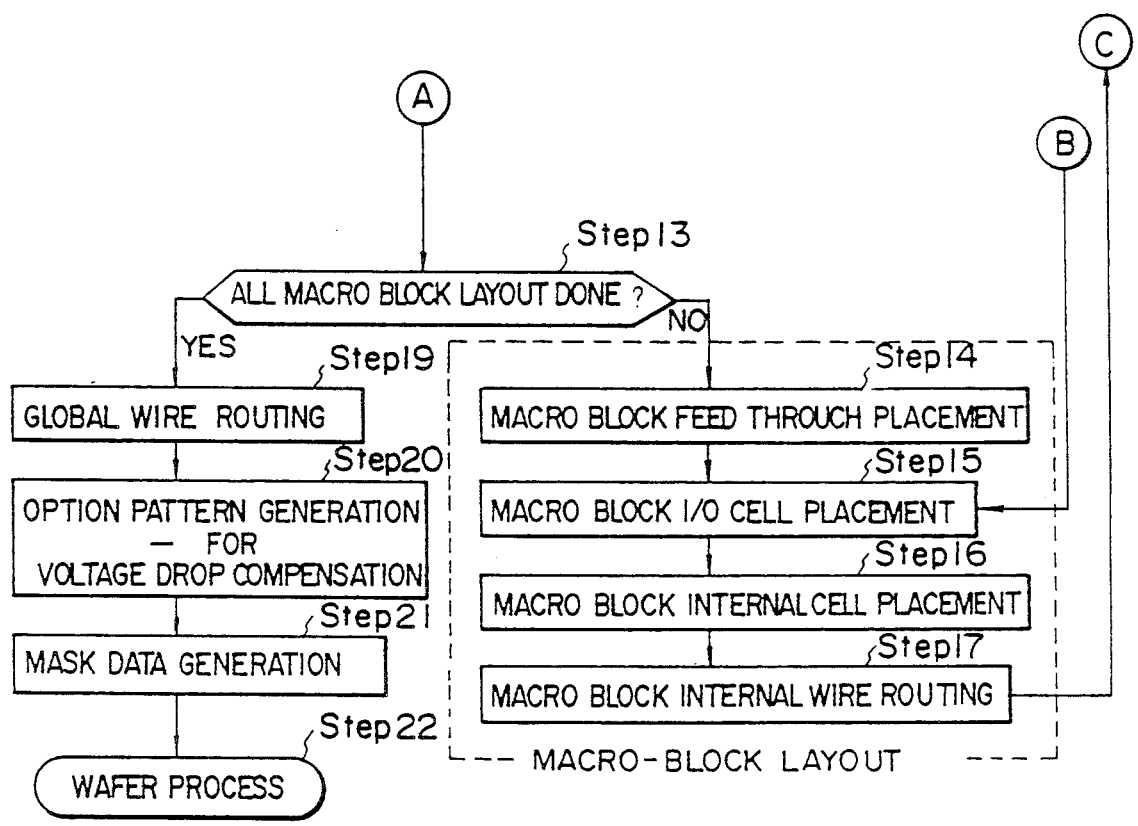

FIGS. 20A and 20B are flowcharts showing the layout process applied to the semiconductor integrated circuit of the present invention.

In a step 1, a schematic circuit diagram of the logic circuit to be formed on the chip 20 is given, and a logic simulation as well as a timing simulation are conducted for this logic circuit in a subsequent step 2. In a step 3, a hierarchical logic net list data representing a primal interconnection of the logic circuit is extracted, and in a step 4, the logic circuit is expanded into various hierarchical levels using the extracted logic net list data. Further, in a step 5, parameters such as the critical path, type and number of the functional blocks formed on the chip and the like are produced. The steps 1 through 3 are common to the conventional steps of designing the semiconductor integrated circuits. The steps 4 and 5 are the interface steps to make the data fit to the layout system and to prepare instruction data to control the layout and to achieve a tuned performance.

In a step 6 and the steps following thereto, the chip floor plan or layout in the hierarchical level of the macro-blocks is started.

In the step 6, the size and construction of the macro-blocks 100 is estimated, using the boundary data of various fundamental gates and devices used in the macro-blocks 100. These semiconductor patterns are available from the cell library. In a step 7, an initial placement of the megacells 24 and macro-blocks 100 is performed. In a step 8 following thereto, an estimation is made for the necessary global channels 25 on the basis of the initial layout of the step 7. In a step 9 performed in parallel to the step 8, an estimation is made for necessary global feed-through channels to be provided in the macro-blocks. Further, an analysis for the delay of signals transferred through the global channels 25 and as well as for the drivability of the various logic gates used in these global net driving is performed in a step 10, taking the estimated delay of signals into consideration.

Next, the logic simulation as well as the timing simulation of the step 2 is performed again and the steps from the step 3 through step 10 are repeated until the drivability of the logic circuit is confirmed. The result of analysis in the step 10 is fed back to a step 12 where a modification of the placement of the macro-blocks is made.

Furthermore, an analysis is made in a step 11, which is performed parallel to the steps 8 and 9, for the necessary current and voltage drop at the time of supplying the power to each of the logic gates in the macro-blocks 100. On the basis of the analysis, modification of the placement of the macro-blocks is made in the step 12, and the steps 8 through 11 are repeated until the supply of necessary current with an allowable voltage drop is reached.

Further, the unit blocks 22 and the mini-macro blocks 23 are placed in the macro-blocks 100 in a step 14, the feed-through path is provided in the macro-blocks 100 in a step 14, the input/output cells are provided on the macro-blocks 100 in a step 15, the internal cells of the macro-blocks 100 are placed in a step 16, and the internal connections in the macro-blocks 100 are completed in a step 17. In each of the steps 14 through 17, the semiconductor pattern stored in the cell library is utilized. Thus, the steps 14 through 17 represent the layout inside the macro-blocks 100.

After the step 17, the macro-block patterns thus completed is replaced by the previously used macro-block patterns in a step 18 and the steps 7 through 11 are repeated until the layout for all the macro-blocks 100 is completed in a step 13.

After all the layout is completed for all the macro-blocks 100, the global routing is performed in a step 19 using the global channels 25 and the macro-block feed-through channels generated in the step 9, and the mask data is generated in a step 21 on the basis of the pattern thus obtained. Another step 20 for optional pattern generation for compensating voltage drops may be provided between the step 19 and the step 21. After the step 21, the actual wafer process 22 is started.

Further, the present invention is not limited to these embodiments described heretofore, but various variations and modifications may be made without departing from the scope of the invention.

What is claimed is:

1. A semiconductor integrated circuit including a plurality of logic devices, comprising:

a plurality of first hierarchical units of logic devices, each of said first hierarchical units comprising a plurality of logic devices having a polycell structure wherein each logic device has a first standardized size in a first direction, said logic devices being arranged in a second direction different from the first direction for a second standardized size in each of the first hierarchical units, each of said first hierarchical units being defined by a first main edge extending in the second direction for said second standardized size, a second main edge opposing to the first main edge and extending in the second direction for said second standardized size, a first side edge extending in the first direction for said first standardized size, and a second side edge opposing to the first side edge and extending in the first direction for said first standardized size, each of said first hierarchical units being constructed by arranging the logic devices so that a generally identical electric power is consumed in each of the first hierarchical units when the semiconductor integrated circuit is operated, each of said first hierarchical units having a first power feed system extending in the second direction for said second standardized size for feeding the electric power to the logic devices therein;

at least a part of said first hierarchical units being arranged in the first direction to form a plurality of second hierarchical units, each of said second hierarchical units being defined by a third side edge extending in the first direction and a fourth side edge also extending in the first direction and opposing the third side edge, said third and fourth side edges having an identical length that is pertinent to the second hierarchical unit to which the third and fourth side edges belong to, wherein, in each of the second hierarchical units, said first and second side edges of the first hierarchical units are respectively aligned with said third and fourth side edges of the second hierarchical unit, said plurality of second hierarchical units being disposed such that there are at least two second hierarchical units having respective positions which are different in the second direction; and second power feed system extending in the first direction so as to cross the first power feed system in each of the first hierarchical units, said second power feed system being connected to the first power feed system of each of the first hierarchical units for feeding the electric power thereto, each of said logic devices having a path of electric current such that the electric current flows generally in the first direction through the path, said logic devices having respective sizes in the second direction and said path of electric current having a size in the second direction which is generally proportional to electric power consumed by the logic device, said path including at least one elongated region extending in the first direction as a resistance.

2. A semiconductor integrated circuit as claimed in claim 1 in which said first power feed system comprises a plurality of power conductors extending parallel to each other in the second direction and separated from each other in the first direction.

3. A semiconductor integrated circuit as claimed in claim 2 in which said first power feed system comprises at least a pair of power conductors one of which extending in the second direction along the first main edge of the first hierarchical unit and the other of which extending in the second direction along the second main edge of the second hierarchical unit.

4. A semiconductor integrated circuit as claimed in claim 3 in which said pair of power conductors are provided so as to offset from the first and second main edges towards an interior of the first hierarchical unit.

5. A semiconductor integrated circuit as claimed in claim 2 in which said second power feed system is provided at a level above the first power feed system and comprises a plurality of power conductors each extending in the first direction and connected to a corresponding one of the plurality of power conductors forming the first power feed system at respective intersections where the power conductor of the first power feed system crosses the power conductor of the second power feed system.

6. A semiconductor integrated circuit as claimed in claim 5 wherein each of the power conductors forming the second power feed system is connected to a corresponding one of the power conductors forming the first power feed system through a via-hole provided in correspondence to the interconnection of the power conductors of the first and second power feed systems.

7. A semiconductor integrated circuit as claimed in claim 2 in which at least a pair of said second hierarchical units are disposed with a separation from each other in the second direction by a space region extending in the first direction such that the third side edge of one of the second hierarchical units forming the pair opposes the fourth side edge of the other of the second hierarchical units in the pair across the space region, said second power feed system comprising a power conductor extending in the first direction in correspondence to said space region for a length to cover at least the entire lengths of the opposing third and fourth side edges of the second hierarchical units forming said pair, said power conductors forming the second power feed system being connected to the corresponding power conductors forming the first power feed system in each of the first hierarchical units included in the second hierarchical units forming said pair.

8. A semiconductor integrated circuit as claimed in claim 7 in which said second power feed system comprises a power conductor provided in correspondence to the space region.

9. A semiconductor integrated circuit as claimed in claim 7 in which said integrated circuit includes therein a plurality of said space regions each separating a pair of the second hierarchical units neighboring each other, each of said space regions having an identical width measured in the second direction and extending straight in the first direction throughout the integrated circuit, said second power feed system comprising a plurality of power conductors extending straight throughout the integrated circuit in the first direction in correspondence to the space regions with a regular repetition in the second direction with a pitch of repetition less than the second standardized size.

10. A semiconductor integrated circuit as claimed in claim 7 in which said space region is used for a first type interconnection for interconnecting one of the logic devices in one of the second hierarchical units and one of the logic devices in the other of the second hierarchical units, said one and the other second hierarchical units being separated from each other by the space region.

11. A semiconductor integrated circuit as claimed in claim 10 in which said first type interconnection is made by interconnection conductors provided in correspondence to the space region at a level below the first power feed system when measured in a direction perpendicular to the first and second directions.

12. A semiconductor integrated circuit as claimed in claim 11 in which there is further provided a second type interconnection for connecting logic devices in the first hierarchical units separated from each other and located in one of said second hierarchical units such that the second type interconnection extends generally in the first direction within the one of said second hierarchical units across the first power feed system at a level above the first power feed system.

13. A semiconductor integrated circuit as claimed in claim 12 further comprising a third type interconnection extending generally in the second direction at the level of the first power feed system.

14. A semiconductor integrated circuit as claimed in claim 12 in which in said second power feed system is provided at level identical with the level of the second interconnection.

15. A semiconductor integrated circuit as claimed in claim 1 in which said power conductors forming the second power feed system comprise at least two different power conductors extending in the first direction for supplying respective source voltages, said different power conductors being repeated in the second direction with a pitch of repetition which is set smaller than the second standardized size of the first hierarchical unit.

16. A semiconductor integrated circuit as claimed in claim 15 in which each of the power conductors forming the second power feed system has a width measured in the second direction such that the semiconductor integrated circuit is covered substantially entirely by the repeating power conductors of the second power feed system.

17. A semiconductor integrated circuit as claimed in claim 1 in which said semiconductor integrated circuit further comprises a third power feed system at a level above the second power feed system so as to extend in the second direction, said third power feed system crossing the second power feed system at respective intersections and connected thereto at via-holes provided in correspondence to the intersection of the second and third power feed systems.

18. A semiconductor integrated circuit as claimed in claim 17 in which said third power feed system comprises at least two different power conductors extending in the second direction and repeated in the first direction with a pitch of repetition which is set smaller than the smallest length of the second hierarchical units formed in the semiconductor integrated circuit.

19. A semiconductor integrated circuit as claimed in claim 18 in which said power conductors extending in the second direction and forming the third power feed system have a width such that the integrated circuit is covered entirely by said power conductors at a level above the second power feed system.

20. A semiconductor integrated circuit as claimed in claim 19 in which said second standardized size of the first hierarchical unit is chosen to be about 600-800 microns.

21. A semiconductor integrated circuit as claimed in claim 1 in which each of said first hierarchical units includes about 10-20 logic devices in a form of polycells.

22. A semiconductor integrated circuit including a plurality of logic devices, comprising:
a plurality of first hierarchical units comprising a plurality of logic devices wherein each of said first hierarchical units has a first standardized size in a first direction and a second standardized size in a second direction different from the first direction;
each of said logic devices in each of the first hierarchical units having a path of electric current such that the electric current flows generally in the first direction through the path;
said logic devices having respective sizes in the second direction and said path of electric current having a size in the second direction which is generally proportional to electric power consumed by a respective one of the logic devices;
said path of electric current including at least one elongated region extending in the first direction as a resistance;
each of said first hierarchical units having a first power feed system extending in the second direction for said second standardized size for feeding the electric power to the logic devices therein;
each of said first hierarchical units being constructed by arranging the logic devices so that a generally identical electric power is consumed in each of the first hierarchical units when the semiconductor integrated circuit is operated.

* * * * *

UNITED STATES PATENT AND TRADEMARK OFFICE
CERTIFICATE OF CORRECTION

PATENT NO. : 5,124,776
DATED : June 23, 1992
INVENTOR(S) : TANIZAWA et al.

It is certified that error appears in the above-indentified patent and that said Letters Patent is hereby corrected as shown below:

TITLE PAGE: [73] Assignee:

After "Kawasaki," insert --Fujitsu VLSI Limited, Kasugai, both of--.

Signed and Sealed this

Seventh Day of June, 1994

*Attest:*

BRUCE LEHMAN

*Attesting Officer*      *Commissioner of Patents and Trademarks*